(12) United States Patent
Garcia Berrios et al.

(10) Patent No.: US 11,715,615 B2
(45) Date of Patent: Aug. 1, 2023

(54) LIGHT MODULATED ELECTRON SOURCE

(71) Applicant: KLA Corporation, Milpitas, CA (US)

(72) Inventors: Edgardo Garcia Berrios, San Jose, CA (US); J. Joseph Armstrong, Fremont, CA (US); Yinying Xiao-Li, San Jose, CA (US); John Fielden, Los Altos, CA (US); Yung-Ho Alex Chuang, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/858,943

(22) Filed: Jul. 6, 2022

(65) Prior Publication Data

US 2022/0336180 A1 Oct. 20, 2022

Related U.S. Application Data

(63) Continuation of application No. 17/020,277, filed on Sep. 14, 2020, now Pat. No. 11,417,492.

(Continued)

(51) Int. Cl.
*H01J 1/304* (2006.01)
*H01J 3/02* (2006.01)
(Continued)

(52) U.S. Cl.
CPC ............ *H01J 1/3044* (2013.01); *H01J 3/022* (2013.01); *H01J 37/073* (2013.01);
(Continued)

(58) Field of Classification Search
CPC ........ H01J 1/3044; H01J 3/022; H01J 37/072; H01J 37/26; H01J 37/00; H01J 37/02;
(Continued)

(56) References Cited

U.S. PATENT DOCUMENTS 788,654 A 5/1905 Lambert
3,755,704 A 8/1973 Spindt et al.
(Continued)

FOREIGN PATENT DOCUMENTS

JP H11213864 A 8/1999
JP 2015201412 A 11/2015

OTHER PUBLICATIONS

Bionta, M.R., article entitled "Wavelength and shape dependent strong-field photoemission from silver nanotips", 2016 New J. Phys. 18 103010, 9 pages.

(Continued)

*Primary Examiner* — Jason L McCormack
(74) *Attorney, Agent, or Firm* — Bever, Hoffman & Harms, LLP

(57) ABSTRACT

A light modulated electron source utilizes a photon-beam source to modulate the emission current of an electron beam emitted from a silicon-based field emitter. The field emitter's cathode includes a protrusion fabricated on a silicon substrate and having an emission tip covered by a coating layer. An extractor generates an electric field that attracts free electrons toward the emission tip for emission as part of the electron beam. The photon-beam source generates a photon beam including photons having an energy greater than the bandgap of silicon, and includes optics that direct the photon beam onto the emission tip, whereby each absorbed photon creates a photo-electron that combines with the free electrons to enhance the electron beam's emission current. A controller modulates the emission current by controlling the intensity of the photon beam applied to the emission tip. A monitor measures the electron beam and provides feedback to the controller.

20 Claims, 7 Drawing Sheets

Related U.S. Application Data

(60) Provisional application No. 62/906,095, filed on Sep. 26, 2019.

(51) Int. Cl.
   *H01J 37/073* (2006.01)
   *H01J 35/06* (2006.01)
   *H01J 37/28* (2006.01)
   *H01J 37/317* (2006.01)

(52) U.S. Cl.
   CPC ............. *H01J 35/065* (2013.01); *H01J 37/28* (2013.01); *H01J 37/3174* (2013.01)

(58) Field of Classification Search
   CPC ...... H01J 37/28; H01J 37/3174; H01J 37/243; H01J 35/065; H01J 2237/06333; H01J 2237/0635; H01J 2201/30426; H01J 2201/3048
   USPC ................................ 250/306, 307, 309, 311
   See application file for complete search history.

(56) References Cited

U.S. PATENT DOCUMENTS

| | | | |
|---|---|---|---|
| 3,864,572 A * | 2/1975 | van der Mast | H01J 37/075 250/306 |
| 3,936,756 A | 2/1976 | Someya et al. | |
| 4,099,055 A * | 7/1978 | Todokoro | H01J 37/28 250/311 |
| 4,099,198 A | 7/1978 | Howorth et al. | |
| 4,555,731 A | 11/1985 | Zinchuk | |
| 5,227,700 A * | 7/1993 | Nagai | H01J 37/243 313/337 |
| 5,363,021 A | 11/1994 | MacDonald | |
| 5,382,867 A | 1/1995 | Yuji et al. | |
| 5,461,280 A | 10/1995 | Kane | |
| 6,153,969 A | 11/2000 | Levine | |
| 6,201,257 B1 | 3/2001 | Stettner et al. | |
| 6,220,914 B1 | 4/2001 | Lee et al. | |
| 6,235,545 B1 | 5/2001 | Derraa | |
| 6,495,955 B1 | 12/2002 | Forbes et al. | |
| 6,724,002 B2 | 4/2004 | Mankos et al. | |
| 6,828,565 B2 | 12/2004 | Steigerwald | |
| 6,837,766 B2 | 1/2005 | Costello | |
| 7,141,791 B2 | 11/2006 | Masnaghetti et al. | |
| 7,154,091 B2 | 12/2006 | Zewail et al. | |
| 7,888,654 B2 | 2/2011 | Tessner, II et al. | |
| 7,928,382 B2 | 4/2011 | Hatakeyama et al. | |
| 8,247,070 B2 | 8/2012 | Cheung et al. | |
| 9,748,071 B2 | 8/2017 | Guerrera et al. | |
| 9,966,230 B1 | 5/2018 | Chuang et al. | |
| 10,133,181 B2 | 11/2018 | Chuang et al. | |
| 10,199,197 B2 | 2/2019 | Chuang et al. | |
| 10,558,123 B2 | 2/2020 | Chuang et al. | |
| 10,643,819 B2 | 5/2020 | Masnaghetti et al. | |
| 10,748,730 B2 | 8/2020 | Chuang et al. | |
| 2003/0222579 A1 | 12/2003 | Habib et al. | |
| 2004/0056279 A1 | 3/2004 | Niigaki et al. | |
| 2004/0135526 A1 | 7/2004 | Winkler et al. | |
| 2005/0264148 A1 | 12/2005 | Maldonado et al. | |
| 2006/0001360 A1 | 1/2006 | Tatsumi et al. | |
| 2006/0151711 A1 | 7/2006 | Frosien et al. | |
| 2008/0211376 A1 | 9/2008 | Yasuda et al. | |
| 2009/0026912 A1 * | 1/2009 | Lordi | H01J 37/063 250/492.23 |
| 2009/0152462 A1 * | 6/2009 | Ishitani | H01J 27/024 250/307 |
| 2010/0148667 A1 | 6/2010 | Niigaki et al. | |
| 2012/0273690 A1 | 11/2012 | Wieland et al. | |
| 2013/0320211 A1 | 12/2013 | Park et al. | |
| 2015/0092923 A1 | 4/2015 | Iida et al. | |
| 2017/0047207 A1 * | 2/2017 | Chuang | G03F 7/70008 |
| 2018/0108514 A1 * | 4/2018 | Chuang | H01J 37/073 |
| 2019/0066962 A1 | 2/2019 | Chuang et al. | |
| 2019/0221399 A1 | 7/2019 | Morishita et al. | |
| 2019/0355545 A1 * | 11/2019 | Zeidler | H01J 37/21 |
| 2020/0118783 A1 | 4/2020 | Chuang et al. | |

OTHER PUBLICATIONS

Cook, Ben, et al., article entitled "Improving the energy spread and brightness of thermal-field (Schottky) emitters with PHAST-PHoto Assisted Schottky Tip", Ultramicroscopy 109 (2009) 403-412 (10 pages).

Fowler, R. H., et al, Electron Emission in Intense Electric Fields, Mar. 31, 1928, 9 pgs.

Jensen, K.L., et al. article entitled "Photon assisted field emission from a silicon emitter" Solid-State Electronics 45 (2001) 831-840, 10 pages.

Keathley, Phillip D., et al., article entitled "Strong-field photoemission from silicon field emitter arrays", Ann. Phys. (Berlin) 525, No. 1-2, 144-150 (2013), published online Dec. 12, 2012, 7 pages.

Lu, J. et al., article entitled "Modification of Si field emitter surfaces by chemical conversion to SIC", Journal of Vacuum Science & Technology B: Microelectronics and Nanometer Structures Processing, Measurement, and Phenomena 12, 717 (1994) published by American Institute of Physics, 6 pages.

Nagao; M. et al, "Damageless vacuum sealing of Si field emitters with CHF3 plasma treatment", Journal of Vacuum Science & Technology B 19(3), American Vacuum Society, May 2001, vol. 19/No. 3, 920-924.

Neo, Yoichiro, et al., article entitled "Electron Optical Properties of Microcolumn with Field Emitter", JJAP 52 (2013) 036603, 5 pgs.

Sarubbi, Francesco et al, article entitled "Chemical Vapor Deposition of α-Boron Layers on Silicon for Controlled Nanometer-Deep p+ n Junction Formation", Journal of Electronic Materials, vol. 39, No. 2, 2010.

Serbun, Pavel et al, article entitled "Stable field emission of single B-doped . . . ", JVSTB, 31, 02B101 (2013); doi: 10.1116/1.4765088, 7 pgs.

Shimawaki, Hidetaka et al., article entitled "Laser-induced Electron Emission from p-type Silicon Emitters", Technical Digest, 014 27th Int'l. Vacuum Mamoelectronics Conference, Jul. 6-10, 2014, 2 pages.

Sugino, Takashi et al., articled entitled "Electron emission from boron nitride coated Si field emitters", Applied Physics Letters 71, 2074 (1997), 4 pages.

* cited by examiner

LIGHT MODULATED ELECTRON SOURCE

RELATED APPLICATIONS

This application is a continuation of U.S. patent application Ser. No. 17/020,277, entitled "LIGHT MODULATED ELECTRON SOURCE" filed Sep. 14, 2020, which claims priority from U.S. Provisional Patent Application No. 62/906,095, entitled "ELECTRON SOURCE", which was filed on Sep. 26, 2019, and is incorporated by reference herein.

FIELD OF THE DISCLOSURE

The disclosure relates generally to systems/devices that utilize electron sources (e.g., scanning electron microscopes, electron-beam lithography systems and X-ray sources). In particular, the disclosure relates to electron sources suitable for use in various semiconductor inspection, metrology, and review systems that are suitable for reviewing and/or inspecting photomasks, reticles, and semiconductor wafers.

BACKGROUND OF THE DISCLOSURE

The integrated circuit industry requires inspection tools with increasingly higher sensitivity to detect ever smaller defects and particles whose sizes may be a few tens of nanometers (nm), or less. These inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest and detect just a small change in signal caused by a defect or particle. High speed inspection is most commonly performed in production using inspection tools operating with UV light. Inspection in R&D may be performed with UV light or with electrons.

Once a defect or particle has been found by high speed inspection, it is often necessary to make a higher resolution image and/or to perform material analysis to determine the origin or type of the particle or defect. This process is commonly called review. Review is usually performed with a scanning electron microscope (SEM). Review SEMs used in semiconductor manufacturing are typically required to review many thousands of potential defects or particles per day and may have, at most, a few seconds per target for review.

Electron microscopes, including review SEMs, utilize an electron source (aka, electron emitter or electron gun) to generate a beam of accelerated electrons that serve to illuminate a target sample, thereby facilitating the review of potential defects on the target sample's surface. Electron sources can be divided into two broad groups: thermionic sources that emit electrons exited by heat (high temperature) and field emission sources that utilize high voltages to emit electrons. Thermionic sources are the most common commercially available electron emitters and are usually made of tungsten or lanthanum hexaboride ($LaB_6$). In thermionic emission, electrons are boiled off the material surface when the electron thermal energy is high enough to overcome the surface potential barrier. Thermionic emitters typically require elevated temperatures (>1300 K for $LaB_6$ and >2500 K for tungsten) to operate, and have several drawbacks such as inefficient power consumption, wide energy spread, short lifetime, low current density, and limited brightness. The demand for more efficient electron sources has driven the research and development of Schottky emitters and cold electron sources such as electron field emitters.

In Schottky emitters, thermionic emission is enhanced by effective potential barrier lowering due to the image charge effect under an applied external electric field. Schottky emitters are typically made of a tungsten wire having a tip coated with a layer of zirconium oxide ($ZrO_x$), which exhibits a much lower work function (~2.9 eV). Thermally assisted Schottky emitters need to be operated at high temperature (>1000° K) and high vacuum (~$10^{-9}$ mbar) and have wider than desirable electron emission energy spread due to the high operating temperature. An electron source with lower energy spread, higher brightness (radiance), and higher current density than Schottky emitters is desirable for semiconductor wafer and mask inspection, review, and lithography as it will enable faster and more cost-effective inspection, review, and lithography.

Cold electron sources, particularly electron field emitters, have been used in field emission displays, gas ionizers, x-ray sources, electron-beam lithography, and electron microscopes, among other applications. A cold electron source utilizes a field emitter cathode that is not electrically heated by a filament (i.e., the cathode emits more electrons than can be supplied by thermionic emission alone), but does not necessarily operate at a low temperature: it is often heated to an operating temperature that is above room temperature by the electron current of the field emission (i.e., the electrons emitted from the cathode). A typical field emitter consists of an emitter cathode having a conical tip and a circular gate aperture (extractor) that are disposed in a low pressure (vacuum) environment. A potential difference is established across the emitter cathode and the gate under an applied external field, resulting in a high electric field at the surface of the tip. Field emission takes place when the applied electric field is high enough to reduce the potential barrier on the tip-vacuum interface so that electrons can tunnel through this barrier at an operating temperature close to room temperature (i.e., quantum-mechanical tunneling). Electrons emitted from the tip in this manner travel toward the positive field source (e.g., an anode), which is biased at a more positive potential than the gate. The emission current density can be estimated by a modified version of the Fowler-Nordheim theory, which takes into account the field enhancement factor due to the field emitters.

Field emitters, because they can operate near room temperature, have lower energy spread than Schottky and thermionic emitters, and can have higher brightness and electron current than thermionic emitters. However, in practical use, the output current of a field emitter is less stable as contaminants can easily stick to the tip of the emitter and change (increase or decrease) its work function, which will change (decrease or increase) the brightness and current and also change the shape of the area from which electrons are emitted. Periodic flashing (i.e., temporarily raising the tip temperature) is required to remove those contaminants. The instrument is not available for operation during the flashing process, which requires significant time (i.e., tens of seconds to a few minutes) to both heat the tip and then allow it to cool and stabilize. In the semiconductor industry, instruments are required to operate continuously and stably without interruption for long periods, so Schottky emitters are usually used in preference to cold field emitters.

Early efforts have been concentrated on developing metallic field emitters. Among others, Spindt-type molybdenum field emitters are perhaps the most well-known metallic field emitters because molybdenum has a low resistivity (53.4 nΩ·m at 20° C.) and a high melting point (2896 K). Nevertheless, metallic emitters suffer from several disadvantages such as lack of uniformity due to metal deposition techniques, and, more severely, the degradation in emission current, mainly due to oxidation.

With the advent of modern semiconductor fabrication technology, there has been investigation of semiconductor field emitters, particularly silicon field emitter as an alternative to metallic nano-tips is silicon field emitters (see for instance P. D. Keathley, A. Sell, W. P. Putnam, S. Guerrera, L. Velasquez-Garcia, and F. X. Kartner, "Strong-field photoemission from silicon field emitter arrays," Ann. Phys. 525, 144-150, 2013). Silicon has practical advantages when it comes to fabricating large scale field emitter structures. Single-crystal (monocrystalline) silicon is an attractive material for field emitters. Silicon crystals can be grown with very high purity and very few crystal defects. The conductivity of silicon can be altered by doping and/or applying a voltage. More importantly, silicon has a well-developed technology base (i.e., silicon field emitters can be fabricated by standard CMOS fabrication techniques).

Even though silicon field emitters have shown promise in recent years, they are not yet commercially available. One serious problem with the use of silicon to form field emitters is that silicon is quite reactive, and can be contaminated within hours, even at pressures around $10^{-10}$ mbar. Silicon very readily forms a native oxide on its surface. Even in a vacuum, a native oxide will eventually form as the small amounts of oxygen and water present in the vacuum will react with the surface of the silicon. The interface between silicon and silicon dioxide has defects (due to dangling bonds) where the probability of an electron recombination is very high. Furthermore, the band gap of silicon dioxide is large (about 9 eV) creating an additional barrier higher than the work function that an electron has to overcome in order to escape, even if the oxide is very thin. For example, native oxide on a smooth silicon surface is typically about 2 nm thick. In some circumstances, oxidation can also change the shape of the field emitters. These aforementioned problems may result in low brightness and current as well as poor stability of emission, the lack of reliability, scalability and uniformity, and have hindered the commercial use of silicon field emitters.

Research effort has been expanded in looking for surface treatments and coatings for field emitters to improve their performance for lower turn-on voltages, higher emission current densities, lower noise, and improved stability. These treatments may include coating the emitter tips with refractory metals, silicides, carbides, and diamond, etc. However, these coating materials are usually limited by the fabrication process in forming smooth and uniform coating surfaces, and/or are often affected by the oxide layer formed on the coating surfaces, creating an additional energy barrier. For these reasons, coated silicon field emitters have not become yet practical as cold electron sources.

Recently, photon assisted electron emission has been studied. Photon energy coming from light sources such as lamps and lasers can further enhance electron emission, which may result in high beam current, high brightness, an intensity which is constant over time, and low FWHM (full width at half maximum) of electron kinetic energy distribution in the beam. Furthermore, modulation of the light beams may be used to modulate the resulting electron beams. Most research studies to date have been concentrated on laser-driven emission from metallic nano-tips such as gold or tungsten (see for instance M. R. Bionta, S. J. Weber, I. Blum, J. Mauchain, B. Chatel, and B. Chalopin, "Wavelength and shape dependent strong-field photoemission from silver nanotips," New J. Phys. 18, 103010, 2016).

What is therefore needed is an electron source that overcomes some, or all, of the limitations of the prior art. In particular, what is needed is an electron source that provides the promising aspects of silicon-based field emitters (i.e., small emitter size, low power consumption, high brightness, high current density, high speed, and long emitter lifetime), while avoiding at least some of the negative aspects that have previously prevented the widespread commercial use of silicon-based field emitter structures.

SUMMARY OF THE DISCLOSURE

The present invention is directed to light modulated electron source that utilizes a photon beam to control the emission current of an electron beam emitted from a field emitter having a silicon-type field emitter cathode. The field emitter cathode includes a p- or n-doped silicon substrate that is etched or otherwise processed on an output (first) surface to provide an integral protrusion having an emission tip. The field emitter also includes at least one electrode (e.g., an extractor and zero or more of a suppressor, a gate/control electrode, and a focusing electrode) that is disposed adjacent to the field emitter cathode and includes an aperture. In some embodiments the extractor is positioned at a height within approximately ±300 nm of a height of the emission tip and maintained at a positive voltage of between about 30 V and 200 V relative to the field emitter cathode, whereby electrons in the doped silicon substrate are attracted toward the emission tip by an applied electric field is generated between the field emitter cathode and the extractor. In some embodiments, one or more additional electrodes are operably arranged downstream of the emission tip such that emitted electrons (i.e., electrons having sufficient energy to overcome the potential barrier at the emission tip surface/interface by way of quantum-mechanical tunneling) are focused or otherwise form an electron beam that passes through the apertures of these additional electrodes. According to an aspect of the invention, a photon-beam source (e.g., a laser or other light source, an optional modulator and an optional light optical system) is configured to generate the photon beam with an energy greater than the bandgap of silicon (i.e., with photons having a wavelength shorter than about 1 μm) and to direct the photons onto the field emitter cathode adjacent to (i.e., directly onto and/or near) the emission tip, whereby at least some of the photons are absorbed by associated silicon atoms of the field emitter cathode and thus enhancing (i.e., by way of photo-assisted field emission) the electron beam's emission current by increasing the number of electrons in a conduction band of the field emitter cathode. That is, the photons absorbed by the silicon create electron-hole pairs in accordance with the photo-electric effect, thereby generating additional free electrons (i.e., photo-electrons) in the field emitter cathode near the emission tip. These photo-electrons combine with (i.e., are added to) the free electrons generated by the applied electric field, thereby enhancing the electron beam's emission current by increasing the total number of free electrons in the field emitter's conduction band (i.e., in comparison to the number of free electrons that would be present in the absence of the photon beam). According to another aspect of the invention, the electron source also includes a control circuit that is configured to modulate the amount of emission current of the electron beam generated by the field emitter cathode by controlling (e.g., selectively increasing or decreasing) the intensity of the photon beam transmitted from the photon-beam source to the field emitter cathode. For example, to increase (or decrease) the emission current, the control circuit controls the photon-beam source to increase (or decrease) the intensity of the photon beam (e.g., by way of a corresponding photon-beam source control signal), thereby increasing (or decreasing) the number of electrons emitted from the field emitter cathode. With this arrangement, the present invention provides an electron source having the beneficial qualities of silicon (i.e., high purity/low defect material, long electron recombination times, and mature silicon-based fabrication process) and the enticing features of field emitters (i.e., small emitter size, low power consumption, high brightness, high current, high speed, and long emitter lifetime), while avoiding at least some of the negative aspects that have previously prevented the widespread commercial use of silicon-based field emitter structures.

In some embodiments, one or more antioxidation coating layers are disposed on at least a portion of the field emitter cathode such that the coating layer(s) entirely contiguously cover at least the emission tip, thereby reducing or eliminating problems associated with the formation of oxides on conventional silicon-based field emitters. In a preferred embodiment, problems associated with conventional silicon-based field emitters are further reduced by utilizing well-established semiconductor fabrication (e.g., standard CMOS) techniques to fabricate the field emitter cathode and the coating layer(s). In one embodiment, the silicon substrate is essentially defect-free monocrystalline (single-crystal) silicon having a thickness in the range of about 10 nm to a few hundred µm. A silicon dioxide or silicon nitride mask material is deposited by PECVD on the top/output (first) surface and then patterned using photolithography. Dry etching (such as RIE, ICP and ECR), wet etching, or a combination of dry and wet etching is then used to form the protrusion, which can take various shapes, such as rounded whiskers (cylindrical posts with round tips), rounded cones, or pyramids, where in each case the protrusion's emission tip has a lateral dimension in the range of 1 nm to 50 nm. The protective layer is then formed entirely over at least the emission tip portion of the protrusion using standard CMOS deposition techniques. In one embodiment, the coating layer comprises an antioxidation material such as substantially pure boron, a boride (e.g., lanthanum hexaboride), or a carbide (e.g., silicon carbide, hafnium carbide or boron carbide), and has a thickness between 1 nm and 10 nm. In other embodiments, the coating layer comprises another material such as boron nitride, titanium nitride, tantalum nitride, or a metal silicide. Fabricating the integral field emitter protrusion and the coating layer using standard CMOS processes facilitates the reliable formation of the coating layer such that it contiguously covers the emission tip and surrounding portions of the protrusion that may form the emitter's output surface, thereby enabling the field emitter cathode to circumvent silicon dioxide's relatively wide bandgap and low conductivity by taking advantage of the field enhancement due to the field emitter including a coating layer to minimize or prevent oxidation of the underlying silicon material.

In one embodiment, the photon-beam source includes a light source (e.g., a laser or other illumination device) configured to generate the photons forming the photon beam at a wavelength within a visible or UV wavelength range (i.e., between 250 nm to 700 nm), whereby a significant fraction of the photons in the photon beam are absorbed by silicon atoms located close to (i.e., within about 1 µm of) the surface of the emission tip, thereby further enhancing the number of electrons available for emission from the field emitter cathode. In some embodiments the photon-beam source also includes a focusing apparatus (e.g., focusing optics including lenses and/or mirrors) and an optional light modulation device that is/are disposed in the photon beam's path between the light source and the field emitter cathode. The focusing optics (e.g., one or more optical elements such as lenses, mirrors or a combination thereof) effectively define the photon beam's path by way of directing and focusing photons emitted from the light source such that at least some of the photon strike the emitter protrusion. In one embodiment, the focusing apparatus includes a curved (e.g., parabolic) mirror that is configured (i.e., positioned and shaped) to direct the photon beam through an aperture formed in at least one of the field emitter's electrodes (i.e., such that the photon beam is redirected from a light source to the field emitter cathode substantially along the same path of, but opposite in direction to, the electron beam emitted from the field emitter cathode). The light modulation device (e.g., an electro-optic modulator or an acousto-optic modulator) is disposed in the photon beam's path and functions to modulate the photon beam, for example, by way of blocking a portion of the emitted photon flux in accordance with an applied light modulator control signal.

As mentioned above, the control circuit (controller) is configured to modulate the electron beam emitted from the silicon-type field emitter cathode by way of controlling a photon-beam source to adjust (e.g., increase or decrease) the photon beam intensity according to a selected modulation scheme. In preferred embodiments the electron source further includes a monitor (i.e., measurement device or sensor) that is configured to sense or otherwise measure the emission current of the electron beam at each moment during operation, and to generate and transmit corresponding emission current measurement values to the control circuit. In one embodiment the monitor is disposed adjacent to the electron beam (i.e., downstream of the field emitter cathode, for example, either adjacent to the aperture of a focusing electrode or on an anode). In some modulation schemes, the control circuit utilizes the emission current measurement as a feedback signal to adjust or maintain the electron-beam current. For example, when modulation scheme involves maintaining the electron beam at a specific electron-beam current, changes in the emission current measurement may reflect intrinsic current fluctuations of the field emitter due to, for example, changes in the work function of the emitter due to the formation of oxides on the field emitter surface. When such intrinsic current fluctuations occur, the control circuit detects the corresponding changes to the emission current measurement and affects corrective adjustments to the photon beam intensity by way of one or more photon-beam source control signals. For example, when the emission current measurement indicates a deviation (increase or decrease) of the electron-beam current from a target level, the control circuit compensates by controlling either the light source or a light modulation device to affect corresponding adjustments (decreases and/or increases) in the photon beam intensity until the emission current measurement indicates the electron-beam's emission current has returned to the target level. By repeating this process each time a deviation is detected, the control circuit utilizes the photon-beam source to maintain the emission current at a substantially constant level (i.e., the target level). Other modulation schemes implemented by the control circuit may include, for example, adjusting the emission current to different values at different times (e.g., periodically switching between a higher current level for high speed scanning and a lower current level for low speed scanning), or strobing the electron beam (i.e., turning the electron beam on/off). In either the high/low or on/off modulation scheme, by providing a switchable (adjustable) light source that is operably controlled by a control circuit, the electron source facilitates modulation of the electron beam's emission current such that it follows in time with the switched photon-beam intensity.

In a specific embodiment, the electron source is configured to implement an on/off modulation scheme in which modulation of the electron beam involves toggling the photon-beam source to switch electron emissions from the field emitter cathode between a minimal/zero (off) current level and a selected non-zero (on) current level. To achieve zero (or near zero) electron emissions when the photon beam is turned off, the field emitter cathode is fabricated on a p-doped silicon substrate and the coating layer is a p-type material (e.g., boron), and the electrode is configured to generate an electric field at the emission tip (i.e., between the field emitter cathode and the electrode/anode) that is maintained just below the field strength at which emission occurs (i.e., the field is such that the emitter cathode's conduction band near the emission tip is maintained just above the cathode's Fermi level in order to prevent or minimize the emission of electrons from the field emitter cathode). Specifically, the electric field is generated such that, during the first time period, the conduction band near the emission tip of the field emitter cathode is maintained at a voltage level that is above the field emitter cathode's Fermi level, thereby minimizing an emission of electrons from emission tip when the photon beam is turned off or minimized. In contrast, during the second time period (i.e., when the photon-beam source is actuated) at least some photons are absorbed by associated silicon atoms of the field emitter cathode, thereby creating photoelectrons in the carrier band that are strongly attracted towards the emission tip, whereby many of these photoelectrons are emitted from the emission tip to produce a photo-assisted field emission of the electron beam from the emission tip at the relatively high (second) current. As such, this embodiment provides a current source that may be rapidly switched between a zero (or substantially zero) electron current and a non-zero electron current entirely by way of turning on/off the photon beam source (i.e., without requiring changes to the electric field applied by the extractor), thereby greatly simplifying the switching process. Of course, the on/off modulation scheme may be further enhanced by way of utilizing a monitor (described above) to assure that the non-zero electron current is maintained at a desired level. In contrast, electron sources that implement the high/low modulation scheme may utilize other configurations by eliminating the need for zero current emissions (e.g., the cathode silicon be n-type doped, so that an abundance of electrons is available to form emission currents even in the absence of a photo beam).

According to various alternative embodiments of the present disclosure, various additional layers and structures are utilized to further enhance the beneficial qualities of the emitter structure in the disclosed electron source. In some embodiments, the extractor is formed on a dielectric (electrically insulating) layer that is disposed on the substrate's top/output surface and patterned to surround the field emitter protrusion (i.e., such that the extractor is separated from the substrate's top/output surface by the dielectric layer). In one embodiment the dielectric layer is formed with a thickness that is less than a height of the emission tip above the substrate surface, whereby a nominal height of the subsequently formed extractor is reliably positioned within the desired approximately ±300 nm range of the emission tip height. In some embodiments one or several gate layers, or control electrodes, are formed over the extractor in order to further control the electric field at the emission tip and achieve fast and accurate control of the emission current. When several gate layers are implemented, insulating layers are used as spacers in between each gate layer. In yet another embodiment, a multi electron-beam source (e.g., a field emitter array, FEA) includes a silicon field emitter cathode having multiple field emitter protrusions arranged in a two-dimensional periodic pattern on the emitter's output surface, where each field emitter protrusion is configured to emit electrons in the presence of an electric field and receives a photon beam in the manner described above.

By using a field emitter formed on the single-crystal silicon substrate, a first layer disposed on top of the field emitter and a photon beam directed towards the field emitter, the present disclosure provides the beneficial qualities of silicon (i.e., high purity/low defect material, long electron recombination times, and mature silicon-based fabrication process), and enables the enticing features of field emitters (i.e., small emitter size, low power consumption, high brightness, high current, high speed, and long emitter lifetime), while avoiding at least some of the negative aspects that have previously prevented the widespread commercial use of silicon-based field emitter structures. In particular, the stability of the electron emission from such emitters can be improved by using light to control the emission current.

In accordance with embodiments of the present disclosure, the electron sources disclosed herein are incorporated into inspection, metrology, and review scanning electron microscopes (SEMs). An SEM includes an electron source, electron optics, and a detector. The electron optics can be configured to de-magnify and focus the primary electron beam onto the sample and the detector can be configured to detect at least one of back-scattered electrons and secondary electrons from the sample. The electron source generates a primary electron beam that is directed toward a sample. The electron optics de-magnifies and focuses the primary electron beam onto the sample. The electron optics also include deflectors that can scan the primary electron beam across an area of the sample. When the primary electron beam strikes the sample, the sample absorbs many of the electrons from the primary electron beam, but scatters some of the electrons (back-scattered electrons). The absorbed energy causes secondary electrons to be emitted from the sample along with X-rays and Auger electrons. The secondary electrons are collected by a secondary electron detector. The back-scattered electrons may be collected by a back-scattered electron detector.

BRIEF DESCRIPTION OF THE DRAWINGS

The present disclosure is illustrated by way of example, and not by way of limitation, in the figures of the accompanying drawings in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The following description is presented to enable one of ordinary skill in the art to make and use the disclosure as provided in the context of a particular application and its requirements. As used herein, directional terms such as "top," "bottom," "over," "under," "upper," "upward," "lower," and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present disclosure is not intended to be limited to the embodiments shown and described but is to be accorded the widest scope consistent with the principles and novel features herein disclosed.

Figure 1:
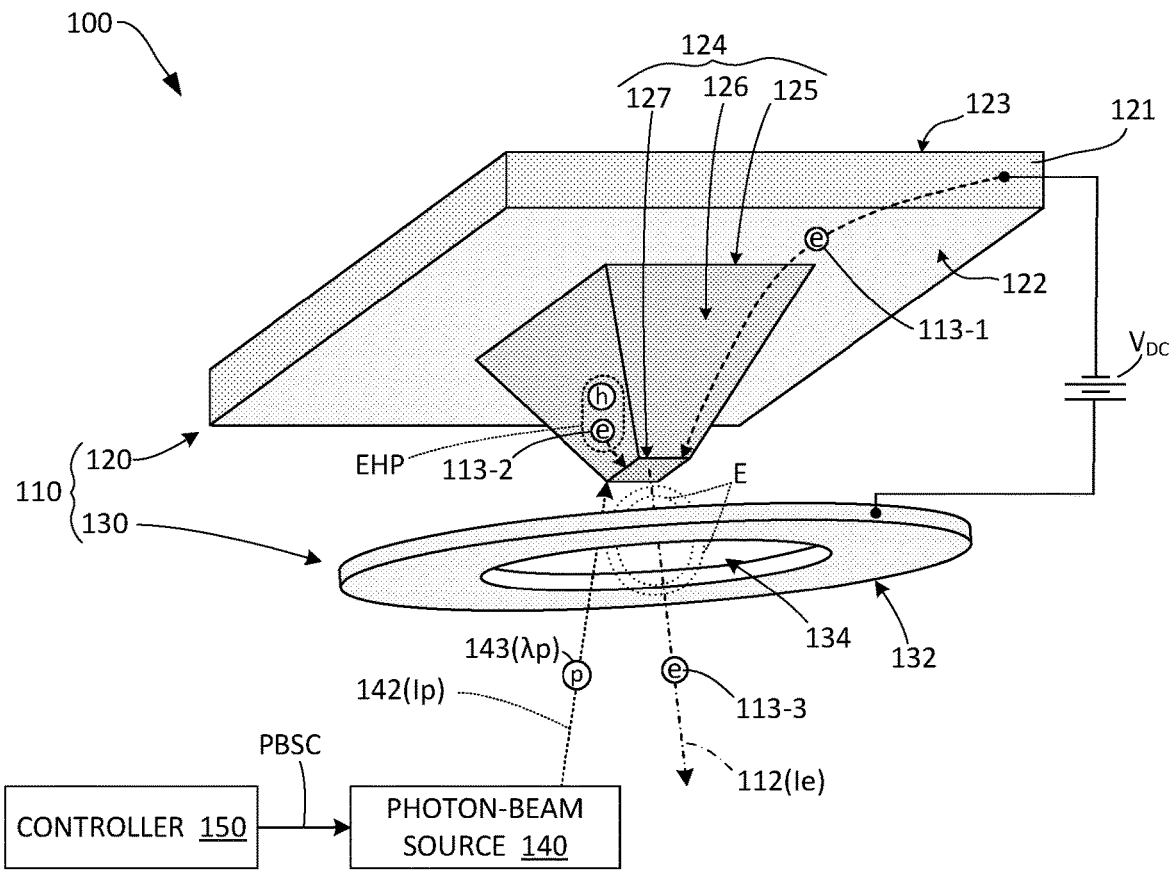
FIG. 1 is a simplified perspective view showing an exemplary light modulated electron source according to an exemplary embodiment of the present invention.

FIG. 1 shows an exemplary light modulated electron source 100 that generates an electron beam 112 according to an exemplary embodiment of the present invention. Electron source 100 generally includes a silicon-based field emitter 110 including a field emitter cathode 120, an extractor (electrode) 130, a photon-beam source 140 and a control circuit 150. The specific shapes and proportions of the structures representing the various elements depicted in the figures (e.g., field emitter cathode 120 and extractor 130 in FIG. 1) are selected solely for descriptive purposes and not intended to convey specific shapes or dimensions.

Field emitter cathode 120 is fabricated on a silicon substrate 121 and includes an integral emitter protrusion 124. Silicon substrate 121 includes a layer of p-type or n-type doped silicon having a top/output (first) surface 122 and an opposing bottom (second) surface 123. Emitter protrusion 124, which is formed/fabricated by removing silicon material from silicon substrate 121, includes a base 125 that is integrally connected to top surface 122, a body portion 126 that extends away from top surface 122, and an emission tip 127 disposed at a distal end of body portion 124.

Figure 2:
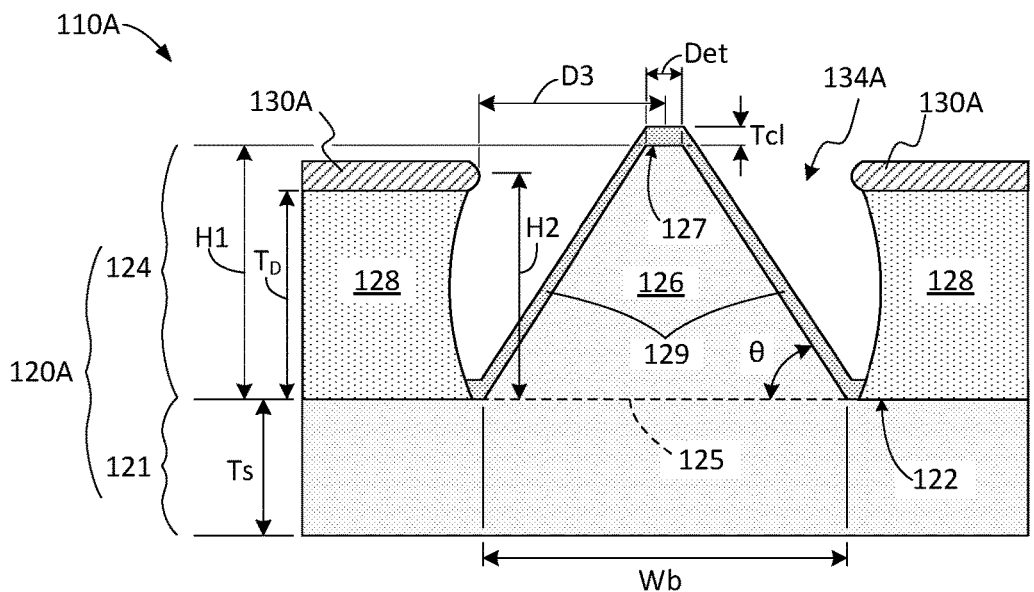
FIG. 2 is a cross-sectional side view illustrating a coated silicon field emitter cathode formed on a silicon substrate according to an exemplary embodiment of the present invention.

Extractor (electrode) 130 is fixedly disposed adjacent to field emitter cathode 120 and configured to generate an electric field E that serves to attract free electrons in silicon substrate 121 (e.g., electron 113-1) toward emission tip 127. Extractor 130 includes a conductive structure 132 that is maintained at a positive voltage relative to field emitter cathode 120 (e.g., as indicated by voltage source $V_{DC}$) to generate electric field E during operation of source 100. When a given free electron 113-1 reaches emission tip 127 with sufficient energy to overcome the potential barrier at the emission tip surface/interface, it passes through the surface/interface (e.g., by way of quantum-mechanical tunneling) and exits (is emitted from) field emitter cathode 120 to become an emitted electron 113-3. Electron beam 112 is generated when emitted electrons 113-3 are generated at a sufficiently high rate, with the emission current Ie of electron beam 112 being defined by the number of emitted electron 113-3 per unit time. Extractor 130 is depicted for exemplary purposes as having a ring-shaped conductive structure 132 defining a central aperture 134 and arranged such that an inner edge of central aperture 134 surrounds either the emission path of electron beam 112 or a portion of protrusion 124. That is, extractor 130 may be positioned downstream of emission tip 127 (i.e., further away from top surface 122 than emission tip 127, e.g., as depicted in FIG. 1) so that the path of electron beam 112, which is depicted by the dash-dot arrow in FIG. 1, passes through aperture 134. Conversely, when extractor 130 is positioned at an equal distance with or closer to top surface 122 than emission tip 127 (e.g., as depicted in FIG. 2, discussed below), then emission tip 127 may be approximately coplanar with or may protrude through aperture 134; in this case, the free electrons 113-1 and 113-2 pass through aperture 134 while still contained within protrusion 124 (i.e., before exiting from emission tip 127 and becoming emitted electrons 113-3).

Photon-beam source 140 is configured to generate and direct a photon beam 142 having an intensity Ip onto field emitter cathode 120. According to an aspect of the invention, photon beam 142 includes photons 143 having an energy greater than the bandgap of silicon (i.e., such that photons 143 that form photon beam 142 have a wavelength λp shorter than about 1 µm), whereby at least some photons 143 are absorbed by associated silicon atoms of field emitter cathode 120. Photon beam 142 is directed (e.g., using optical elements described below) onto surface portions of field emitter cathode 120 that are adjacent to (i.e., directly onto and/or near) the emission tip 127, whereby at least some of the photons 143 are absorbed by associated silicon atoms of field emitter cathode 120. As indicated in FIG. 1, each photon 143 absorbed by field emitter cathode 120 creates an electron-hole pair EHP according to the photo-electric effect, thereby releasing a photo-electron 113-2 in field emitter cathode 120 and increasing the number of free electrons in the field emitter's conduction band, thereby increasing the number of emitted electrons and causing a corresponding increase in emission current Ie of electron beam 112. That is, in the absence of photon beam 142, the number of free electrons 113-1 in the field emitter's conduction band is relatively low, whereby electron beam 112 has a relatively low emission current Ie. When generated with a sufficient intensity Ip, photon beam 142 facilitates photo-assisted field emission (i.e., the generation of electron beam 112 with an enhanced/increased emission current Ie)

by way of increasing the number of free electrons in the field emitter's conduction band (i.e., by supplementing the free electrons 113-1 in the conduction band with photo-electrons 113-2).

According to another aspect of the invention, control circuit 150 is configured to modulate the emission current Ie of electron beam 112 by controlling the operation of photon-beam source 140 in a way that adjusts the intensity Ip of photon beam 142. In some embodiments control circuit 150 is a processor, field programmable device or application-specific integrated circuit that is produced and configured in accordance with known techniques such that it functions to implement a selected electron beam modulation scheme, such that it generates one or more photon-beam source control signals PBSC in accordance with the selected modulation scheme, and such that it functions to transmit photon-beam source control signals PBSC to photon-beam source 140. Various modulation schemes are described below, one of which includes periodically switching the emission current Ie of electron beam 112 between a high current level and a low current level. In this example, to increase the emission current Ie from the low current level to the high current level, control circuit 150 generates/transmits photon-beam source control signal PBSC with a first value that causes photon-beam source 140 to increase the intensity Ip of photon beam 142, thereby causing a corresponding increase in emission current Ie in the manner described above. Conversely, to decrease emission current Ie from the high current level to the low current level, control circuit 150 generates photon-beam source control signal PBSC with a second value that causes photon-beam source 140 to decrease photon-beam intensity Ip.

FIG. 2 illustrates, in cross section view, a field emitter 110A of an electron source according to an exemplary embodiment. Note that features of field emitter 110A that are essentially the same as those of field emitter 110 (shown in FIG. 1) are identified using the same reference numbers, meaning that details of the corresponding features mentioned with reference to both FIGS. 1 and 2 are applicable to both field emitters 110 and 110A. The suffix "A" at the end of a reference number indicates that a related feature may be different. This convention is also used in other embodiments described below with reference to FIGS. 3 to 8, where different suffix letters indicate one or more differences with previously described embodiments.

Field emitter cathode 120A is formed on a silicon substrate 121 having a field emitter protrusion 124 disposed on upward-facing output (top) surface 122. In preferred embodiments, silicon substrate 121 is essentially defect-free monocrystalline silicon (i.e., a single crystal of silicon) having a thickness Ts in the range of about 100 nm to a few hundred μm. In some embodiments, silicon substrate 121 is p-type doped with a doping level less than about $10^{19}$ cm$^{-3}$ (i.e., a resistivity of about 0.005 Ω·cm or higher). Since minority carrier lifetime and diffusion length decrease with increasing dopant concentration, dopant concentrations higher than about $10^{19}$ cm$^{-3}$ may be used when the silicon is very thin, (e.g., when substrate thickness Ts is thinner than about 1 μm), whereas when substrate thickness Ts is greater than about 1 dopant concentrations lower than about $10^{19}$ cm$^{-3}$ may be preferred. For silicon that is thicker than a few microns, such as a thickness Ts of 10 μm or more, much lower dopant concentrations, such as less than about $10^{14}$ cm$^{-3}$, may be preferred to ensure long carrier lifetime and low dark current. In an alternative embodiment, the silicon may be n-type doped with a dopant concentration of about $10^{15}$ cm$^{-3}$ or greater. For example, the silicon may be n-type doped with a dopant concentration between about $10^{15}$ cm$^{-3}$ and $10^{19}$ cm$^{-3}$. Silicon with n-type doping has more electrons available in the conduction band than p-doped substrates, which may be drawn toward emission tip 127 to form the desired emission current. In both the n-doped and p-doped substrates, the number of electrons in the conduction band may be increased by illuminating the field emitter with light as described below. A p-doped substrate may be preferred when it is desired that the modulation be large as the number of electrons in the conduction band will be very low when the photon beam intensity is zero or low, and the relative increase in the number of electrons in the conduction band when the photon beam intensity is increased will be large. An n-doped substrate may be preferred when high electron emission current is desired because of the larger number of electrons in the conduction band. In this case, the relative range of current adjustment that can achieved may be smaller than for p-doped silicon, but the range of current control will generally be sufficient for reducing or canceling noise in the electron emission.

In one embodiment, field emitter protrusion 124 is formed with a pyramidal shape (e.g., as indicated in FIG. 1) by anisotropic etching that produces a slope angle θ close to 54.7° since that angle corresponds to the intersection of the (100) and (111) planes in monocrystalline silicon. Oxidation sharpening, which may be performed at a low to moderate temperature (less than about 950° C.), may be used prior to depositing or forming contiguous coating layer 129 when sharp field emission tips are desired. In an exemplary embodiment, an exemplary protrusion 124 has a base width Wb in the range of 2 to 5 μm, and a base-to-tip height H1 in the range of 2 to 10 μm. Emission tip 127, which is formed at the distal end (apex) of sharpened protrusion 124 may comprise, at atomic scale lengths, a substantially flat area, such as a surface substantially parallel to a crystal plane of silicon crystal substrate 121, for example substantially parallel to a (100) plane. In FIG. 2 a characteristic lateral dimension, such as a diameter, of the emission tip 127 is indicated by Det. In a preferred embodiment Det may be between about 1 nm and about 50 nm. For example, Det may be less than about 50 nm or less than about 20 nm.

In some embodiments, field emitter protrusion 124 may be formed using non-pyramid shapes, such as rounded whiskers (cylindrical posts with round tips) or rounded cones (not shown). Rounded whiskers, or rounded cones with an approximately zero-degree half angle, provide a higher field enhancement in comparison with rounded cones or pyramids, with a half angle much greater than zero degrees. However, rounded whiskers are worse heat conductors than rounded cones or pyramids of a similar height. Thus, there is usually a trade-off between field enhancement and thermal stability.

Field emitter cathode 120A includes an antioxidation coating layer 129 that entirely contiguously covers (i.e., forms an unbroken layer devoid of openings or holes) at least emission tip 127. In the exemplary embodiment of FIG. 2, coating layer 129 is depicted as a continuous layer disposed over an entirety of protrusion 124 such that all surfaces of body portion 126 and emission tip 127 are entirely contiguously covered by coating layer 129. In other embodiments (not shown) coating layer 129 may be selectively formed only over the distal end of protrusion 124 (i.e., over the entirety of emission tip 127 at least a portion of body portion 126 located adjacent to the distal end of protrusion 124). In yet other embodiments (e.g., such as that depicted in FIG. 3), coating layer 129 may extend over top/output surface 122. In exemplary embodiments, the contiguous antioxidation coating layer 129 comprises one of substantially pure boron, silicon carbide, a boride material (such as lanthanum hexaboride), a carbide material (such as hafnium carbide), a metal silicide (such as titanium silicide), a semi-metallic nitride (such as titanium nitride or tantalum nitride), and a semiconducting nitride (such as boron nitride). Forming coating layer 129 such that it contiguously covers emission tip 127 means that coating layer 129 hermetically seals emission tip 127 against oxidation. To ensure that coating layer 129 provides a good hermetic seal without forming a strong barrier to electron emission, coating layer 129 is formed with a thickness Tc1 between about 1 nm and 10 nm. All native oxide may be removed from the silicon surface, for example, by performing a wet clean followed by an in-situ thermal hydrogen clean prior to depositing coating layer 129. Details of methods for coating silicon with boron can be found in Sarubbi et al. "Chemical vapor deposition of a-boron layers on silicon for controlled nanometer-deep p+-n junction formation," J. Electron. Material, vol. 39, pp. 162-173, 2010, and in U.S. Pat. Nos. 10,133,181 and 10,748,730, both to Chuang et al., all of which are incorporated herein by reference. Details of methods for coating a silicon emitter with silicon carbide can be found in M. Nagao et al., "Damageless vacuum sealing of Si field emitters with $CHF_3$ plasma treatment", J. Vac. Sci. Technol. B, Vol. 19, No. 3, May/June 2001, pp. 920-924, in J. Liu et al., "Modification of Si field emitter surfaces by chemical conversion to SiC", J. Vac. Sci. Technol. B, Vol. 12, No. 2, March/April 1994, pp. 717-721, and in Published US Patent Application 2020/0118783, entitled "Electron Gun and Electron Microscope" and filed by Chuang et al. on Sep. 11, 2019. All of these documents are incorporated by reference herein. Other materials may be coated onto the silicon by a CVD, a plasma-enhanced CVD or a PVD process as appropriate.

According to a presently preferred embodiment, field emitter 120A is fabricated using standard CMOS fabrication processes. For example, substrate 121 may be prepared for etching using silicon dioxide or silicon nitride as a mask material that is deposited by PECVD, and photolithography can then be used to pattern the mask material. Dry etching (such as RIE, ICP and ECR), wet etching, or a combination of dry and wet etching can then be used to form emitter protrusion 124. Oxidation sharpening, which is usually performed at low to moderate temperature (e.g., less than about 950° C.), may be used prior to forming coating layer 129 when sharp field emitter tips are desired. Coating layer 129 may then be deposited over exposed portions of emitter protrusion 124 using standard CMOS deposition processes.

Referring again to FIG. 2, field emitter cathode 120A includes an extractor electrode (or gate electrode) 130A that is maintained close to the height of emission tip 127 and attached to substrate 121 by a dielectric layer 128, and is configured to facilitate fast and accurate control of emission current Ie. Preferably a nominal height H2 of extractor 130A above top surface 122 is approximately ±300 nm relative to base-to-tip height H1 of emission tip 127. Thus, dielectric layer 128 is approximately equal to or less than the height of emission tip 127. Preferably thickness $T_D$ of dielectric layer 128 is greater than about one tenth of the height H1 of emission tip 127. Preferably a horizontal separation D3 between the emitter tip 127 and the inside edge of extractor 130A, which defines aperture 134A, is between about 100 nm and 1 µm. Dielectric layer 128 may comprise one or more dielectric materials, such as $SiO_2$ or $Si_3N_4$. Dielectric layer 128 is disposed on top surface 122 surrounding field emitter protrusion 124A but does not necessarily cover field emitter protrusion 124. In another instance, dielectric layer 128 partly covers field emitter protrusion 124. In preferred embodiments extractor 130A and dielectric layer 128 are fabricated by standard CMOS fabrication techniques such as using PVD, CVD, or ALD deposition methods. Extractor 130A may comprise a metal or polysilicon. The simplest emitter design is the triode configuration in which only one gate electrode, configured as extractor 130A, is used, but other configurations are possible. Extractor 130A is typically formed on a top surface of dielectric layer 128, comprising one or several insulating layers, deposited on the substrate 121. Two or more gate layers (not shown) may be utilized in more complex emitter designs, where multiple dielectric layers are used as spacers in between sequentially formed gate layers. In such an embodiment, each gate electrode would have a different function. Only one electrode would act as the extractor, while another gate (or gates) could be used, for example, to control the divergence angle of the electron beam. Placing extractor 130A close to emission tip 127 allows a sufficiently strong electric field to be generated from a low voltage (such as a voltage between about 30 V and about 200 V), which has the advantage of minimizing back-bombardment of the emitter by highly energetic ions that can reduce the lifetime of the emitter. Since extractor 130A is placed close to emission tip 127, aperture 134A defined in extractor 130A should be precisely aligned to emission tip 127. For example, the center of aperture 134A may be aligned to emission tip 127 within about 5% or less of diameter of aperture 134A. More details of field emitter cathode structures including one or more gates (electrodes) and methods of fabricating such structures can be found in H. Shimawaki et al., "Laser-induced Electron Emission from p-type Silicon Emitters", Technical Digest, 2014 27$^{th}$ International Vacuum Nanoelectronics Conference, P2-27, A. Koike et al., "Field Emitter Equipped with a Suppressor to Control Emission Angle", IEEE Electron Device Letters, Vol. 34, No. 5, May 2013, pp. 704-706, and M. Nagao et al., "Fabrication of a Field Emitter Array with a Built-in Einzel Lens", Japanese Journal of Applied Physics, Vol. 48, 2009, 06FK02. All of these documents are incorporated herein by reference.

Figure 3:
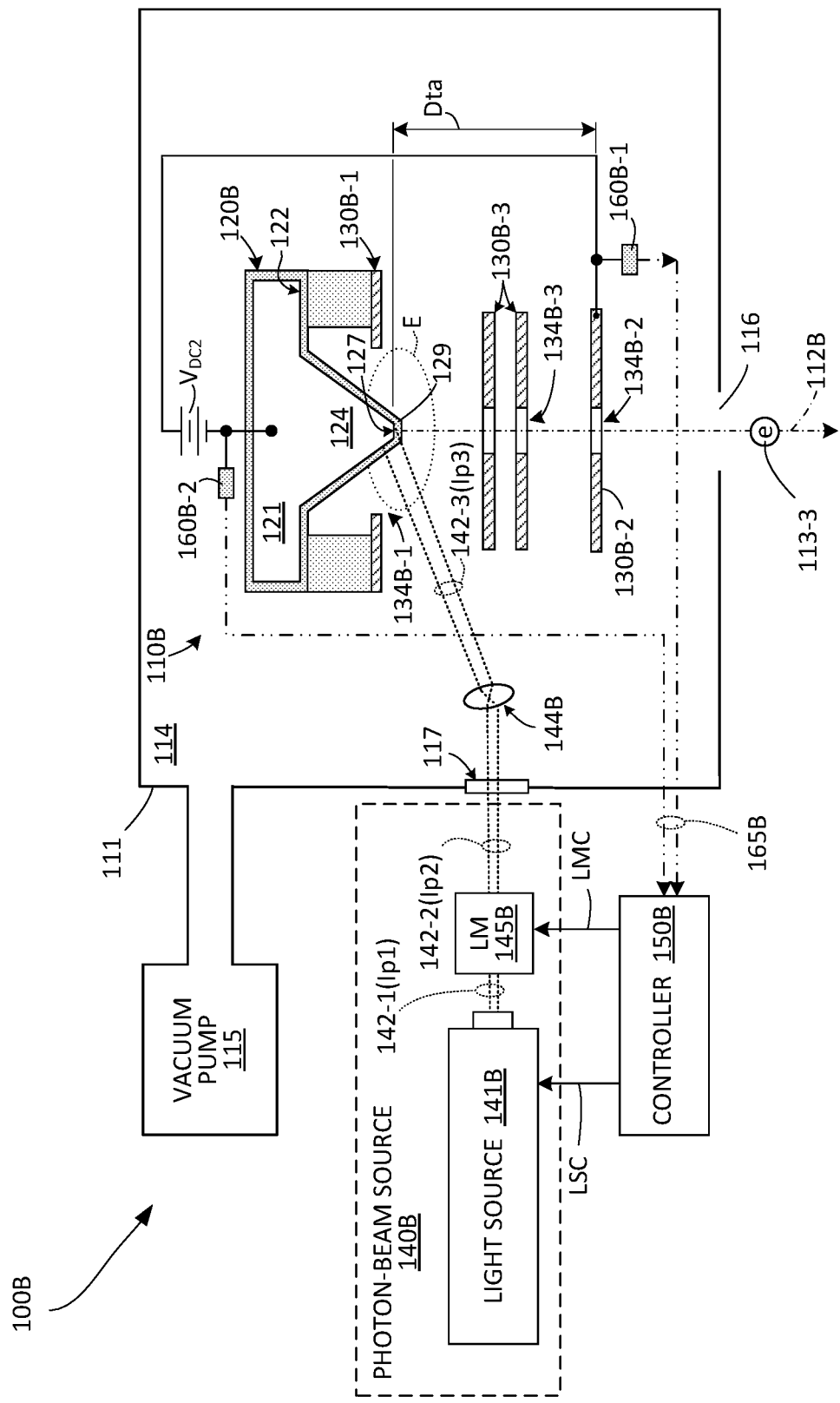
FIG. 3 is a block/circuit diagram illustrating a simplified electron source according to an alternative embodiment of the present disclosure.

FIG. 3 illustrates an electron source 100B according to another embodiment of the present invention. Electron source 100B includes a housing 111 that contains field emitter 110B, a photon-beam source 140B and a control circuit 150B.

Housing 111 is formed around a low-pressure chamber 114 and includes a vacuum pump 115, such as an ion pump or a getter pump, that is configured to maintain chamber 114 under higher vacuum conditions (i.e., lower pressure) than outside housing 111. Field emitter 110B is disposed in chamber 114 and includes an emitter cathode 120B, an extractor 130B-1 having an aperture 134B-1 and an anode 130B-2 having an aperture 134B-2. Field emitter cathode 120B is formed on a silicon substrate 121 having a field emitter protrusion 124 disposed on output (top) surface 122, and a coating layer 129 is formed at least over the surfaces of protrusion 124. Extractor 130B-1 is positioned over top surface 122 and is configured to operate as described above with reference to FIG. 2. Anode 130B-2 is disposed at an offset distance Dta of at least 1 mm from emission tip 127 and is maintained at a positive voltage $V_{DC2}$ of at least 500 V relative to field emitter cathode 120B. The electron source 100B may further include one or more additional optional electrodes 130B-3 having associated apertures 134B-3. Optional electrodes 130B-3 may include one or more focusing electrodes, one or more deflectors, a stigmator, and/or a beam blanker. Additional electrodes 130B-3 are depicted as positioned upstream (i.e. closer to field emitter cathode 120B) than anode 130B-2 but might be placed upstream or downstream of anode 130B-2 as necessary to achieve the desired function and performance. Extractor 130B-1, anode 130B-2 and optional electrodes 130B-3 are configured such that emitted electrons 113-3 form an electron beam 112B that passes through apertures 134B-1, 134B-2 and 134B-3 and exit chamber 114 by way of a small opening 116, which is sized such that it limits the diffusion of gas into chamber 114 and enables pump 115 to maintain chamber 114 at the desired low pressure. In some embodiments, electron source 100B includes a magnetic lens (not shown) that functions to focus and/or deflect the electron beam 112.

Photon-beam source 140B includes a light source (e.g., a laser or other illumination device) 141B, an optional focusing apparatus 144B and an optional light modulation device 145B. In this configuration light source 141B and light modulation device 145B are depicted as being disposed outside housing 111 and focusing apparatus 144B is depicted inside chamber 114. In other embodiments, one or more elements of focusing apparatus 144B may be positioned outside housing 111, or one or both of light source 141B and light modulation device 145B may be mounted inside chamber 114. Light source 141B generates a photon beam that illuminates field emitter cathode 120B. For descriptive purposes the photon beam is identified in three sections that define the photon beam path, including a first photon beam section 142-1 extending from light source 141B to light modulation device 145B, a second photon beam section 142-2 extending from light modulation device 145B through a window 117 (or other light-transparent feature in the wall of housing 111) to light optics 144B, and a third/terminal photon beam section 142-3 extending from light optics 144B to field emitter cathode 120B. In one embodiment light source 141B is configured to generate photons 143 at a wavelength within a visible or UV wavelength range (i.e., between 250 nm to 700 nm), whereby a significant fraction of photons 143 directed along terminal light beam portion 142-3 onto field emitter cathode 120B are absorbed by silicon atoms located close to the surface of the emission tip 127, thereby further enhancing the generation of photoelectrons for a given photon beam intensity Ip. Focusing apparatus 144B is implemented by one or more optical elements, such as lenses and/or mirrors, and associated positioning structures collectively configured to form focusing optics that focus and/or direct photons 143 generated by light source 141B along the photon beam path such that terminal photon beam segment 142-3 is directed onto field emitter cathode 120B. Focusing apparatus 144B may be omitted when all necessary focusing and directing functions are performed by light source 141B. Light modulation (LM) device 145B (e.g., an electro-optic modulator or an acousto-optic modulator) is configured to modulate the photon beam (i.e., such that terminal photon beam segment 142-3 has a selected intensity Ip3), for example, by way of selectively blocking or diverting none, some or all the photon flux transmitted between light source 141B and field emitter cathode 120B in response to a light modulation control signal LMC. For example, when light modulation control signal LMC has a "de-activate" value, light modulation device 145B is configured to pass substantially all photons 143 to field emitter cathode 120B (i.e., intensity Ip1 of beam section 142-1 is substantially equal to intensity IP2 of beam section 142-2, which in turn is substantially equal to intensity Ip2 of beam section 142-2). Conversely, when light modulation control signal LMC has a "fully-activate" value, light modulation device 145B is configured to block substantially all photons 143 from reaching field emitter cathode 120B (i.e., intensities Ip2 and Ip3 are substantially zero). When light modulation control signal LMC has a "partially-activate" value, light modulation device 145B is configured to block a corresponding portion of the photons 143 generated by light source 141B (i.e., intensity Ip2 is lower than intensity Ip1 by an amount determined by the partial activation level of light modulation device 145B). Light modulation device 145B may be omitted when all necessary light modulation functions are performed by light source 141B in the manner described below. An advantage of light modulation using an electro-optic or acousto-optic modulator is that such modulators can be modulated at frequencies of hundreds of MHz or a few GHz allowing fast modulation or switching of the electron beam. In contrast, electrical modulation of one or more electrodes may be practically limited to a few MHz or a few tens of MHz because the large capacitance of the electrodes would require very high drive currents in order to change their voltages quickly.

Control circuit 150B is configured to modulate emission current Ie the electron beam 112B emitted from electron source 100B by controlling the intensity Ip3 of terminal photon beam section 142-3, which in turn is achieved by controlling at least one of light source 141B (e.g., using a light source control signal LSC) and light modulation device 145B (e.g., using light modulation control signal LMC). In one embodiment, control circuit 150B controls photon beam intensity Ip3 by controlling the amount of photon flux passed through modulator 145B in the manner described above. For example, control circuit 150B generates and transmits light modulator control signal LMC with a value (e.g., voltage level) corresponding to the desired intensity level (e.g., such that the fraction of photons blocked by modulator 145B is proportional to a voltage level of light modulator control signal LMC). In other embodiments, light source 141B is configured to generate first photon beam section 142-1 with an intensity Ip1 that is adjustable in response to light source control signal LSC between off (zero) and full (maximum) intensity levels, control circuit 150B controls photon beam intensity Ip3 by varying the operating power level of light source 141B (e.g., control circuit 150B causes the light source 141B to increase or decrease intensity Ip3 by way of increasing/decreasing the voltage level of light source control signal LSC).

Electron source 100B includes at least one monitor 160B-1 and/or 160B-2 that is/are operably disposed to measure emission current Ie of electron beam 112B. Exemplary current monitor 160B-1 is electrically connected to anode 130B-2, whereby exemplary monitor 160B-1 is operably disposed to measure that part of the emission current Ie that impinges on anode 130B-2 and does not pass through aperture 134B-2. Anode 130B-2 may be configured such that aperture 134B-2 functions as a beam stop aperture that limits the angular spread and diameter of the electron beam 112B that exits the electron source. In this case, a significant fraction, such as greater than 50%, of the current emitted by the field emitter 110B may be stopped by anode 130B-2. Hence although the current monitored by 160B-1 is not the entire emission current, it is strongly correlated with the total emission current and can be used to control and stabilize the total emission current. Alternatively, or in addition, current monitor 160B-2 monitors the emission current from field emitter cathode 120B. In other embodiments, monitors may be connected to other electrodes (e.g., electrode 130B-3, or a beam stop electrode disposed downstream from opening 116). Monitors 160B-1 and 160B-2 are operably configured (using known techniques) to generate current measurement values 165B determined by a measured amount of emission current Ie. Control circuit 150B is configured to receive and utilize emission current measurements 165B as a feedback signal to adjust the intensity Ip3 of photon beam terminal section 142-3 according to a selected modulation scheme (discussed below) by controlling either light source 141B or light modulation device 145B in the manner described above.

As mentioned above, control circuit (controller) 150B is configured to modulate electron beam 112B by way of controlling a photon-beam source 140B according to a selected modulation scheme (method). According to one such modulation scheme, control circuit 150B utilizes emission current measurements 165B as a feedback signal to maintain or adjust electron beam 112B to maintain a selected target emission current level. To implement this modulation scheme using electron source 100B, control circuit 150B is configured to continuously monitor emission current Ie by way of emission current measurements 165B, and to adjust a photon-beam source control signal (e.g., either light source control signal LSC or light modulation control signal LMC) to cause a corrective change to intensity Ip3 of terminal photon beam segment 142-3. As mentioned above, emission current Ie may undergo intrinsic current fluctuations due to, for example, changes in the emitter work function caused by contamination on emission tip 127. In one exemplary embodiment, when a decrease in the level/value of emission current measurements 165B indicates that such a change has occurred, control circuit 150B then utilizes the emission current measurements 165B to modify light source control signal LSC to a value (e.g., voltage level) that causes light source 141B to increase the light source's output power, thereby increasing intensity Ip1 of the photon beam section 142-1 emitted from the light source 141B, which in turn increases emission current Ie of electron beam 112B. In another exemplary embodiment, control circuit 150B utilizes the decreased emission current measurements 165B to modify light modulation control signal LMC to a value that causes light modulation device 145B to allow a larger portion of photon beam section 142-1 to pass, thereby increasing intensity Ip2. In both cases, the increased photon beam intensity is passed to field emitter cathode 120B, there causing a corresponding increase in emission current Ie of electron beam 112B. The process of monitoring the resulting change to emission current measurements 165B and transmitting subsequent control signal changes to photon-beam source 140B is repeated until emission current Ie of electron beam 112B has returned to the target level.

Figure 4:
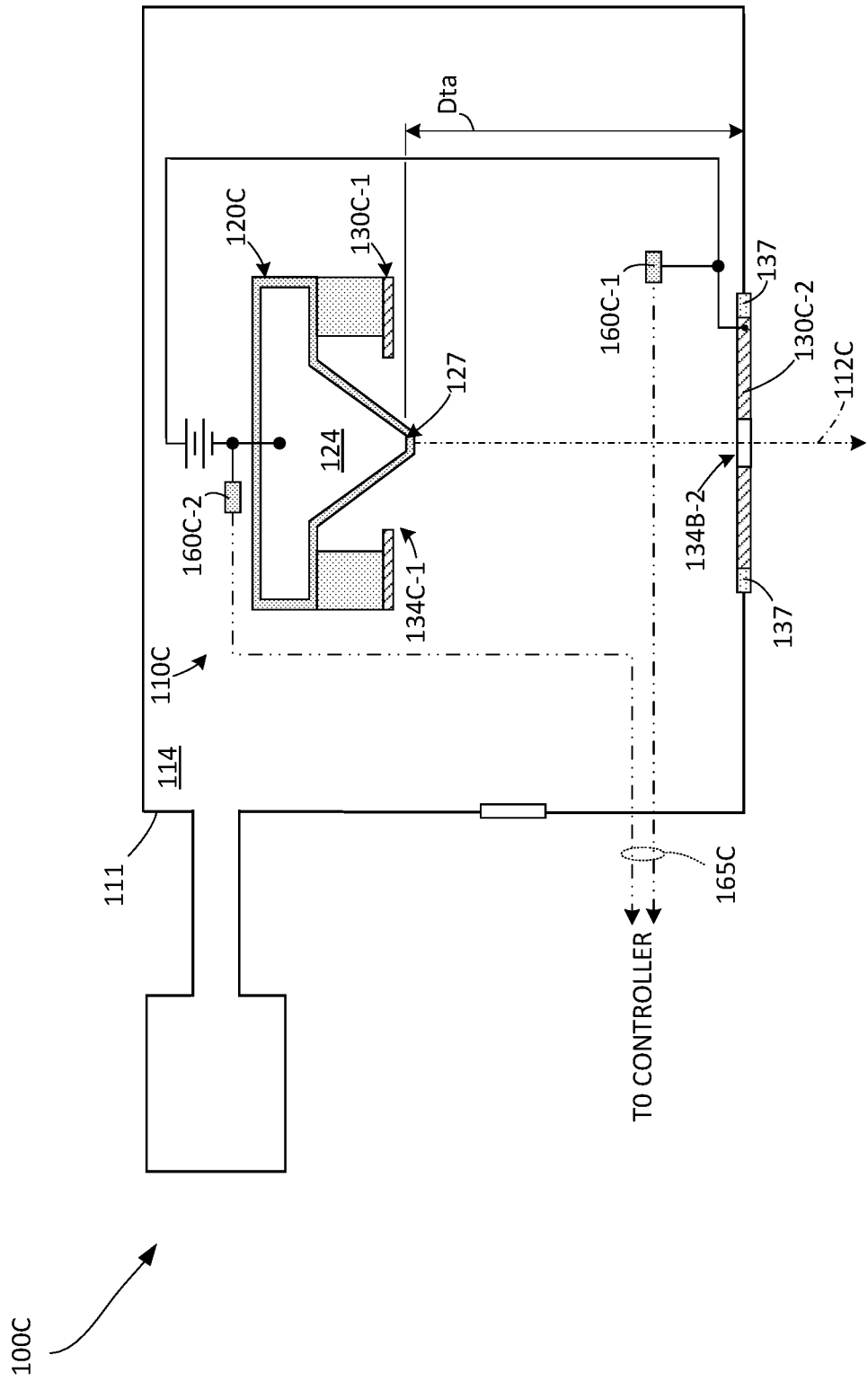
FIG. 4 is a block/circuit diagram illustrating a partial simplified electron source according to another alternative embodiment of the present disclosure.

FIG. 4 depicts a partial electron source 100C according to another embodiment. Electron source 100C is similar to electron source 100B (FIG. 3) in that it includes a field emitter 110C disposed in low-pressure chamber 114, and also include a photon-beam source (not shown) and a control circuit (not shown) that are configured to operate in the manner described above with reference to FIG. 3. Similar to field emitter 110B (FIG. 3), field emitter 110C includes a cathode 120C having a protrusion 124, an extractor 130C-1 disposed adjacent to emission tip 127, an anode 130C-2 positioned at distance Dta from emission tip 127, and a pair of monitors 160C-1 and 160C-2 that generate emission current measurements 165C in the manner described above. Electron source 100C differs from electron source 100B in that anode 130C-2 is mounted onto a lower wall of housing 111 such that aperture 134B-2 obviates the need for a separate differential pumping aperture (i.e., opening 116 shown in FIG. 3). That is, aperture 134C-2 functions both as a differential pumping aperture and to transmit electron beam 112C out of housing 111. To facilitate maintaining anode 130C-2 at a different potential than that of housing 111, anode 130C-2 is attached to the lower wall of housing 111 by way of insulator 137, which also functions to maintain a vacuum seal that enables low pressure chamber 114 to be maintained at a desired low pressure. Similar to electron source 100B described with reference to FIG. 3, electron source 100C may, optionally, be further configured to include an additional electrode or magnetic lens (not shown).

Figure 5B:
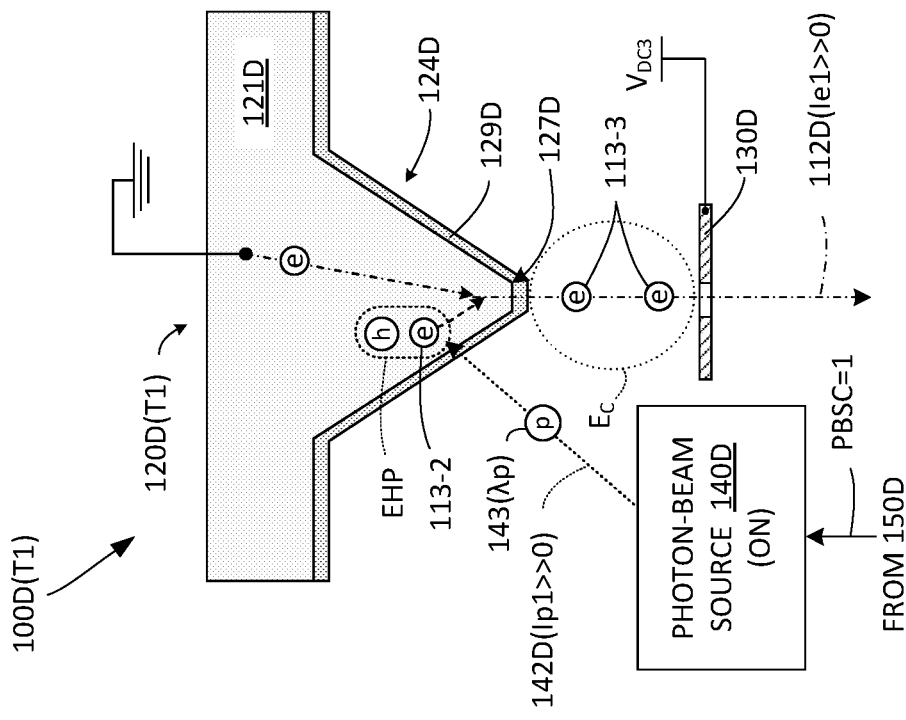
FIGS. 5A and 5B are cross-sectional side views illustrating a field emitter cathode during operation of an electron source implementing an on/off modulation scheme according to another embodiment of the present invention.
Figure 5A:
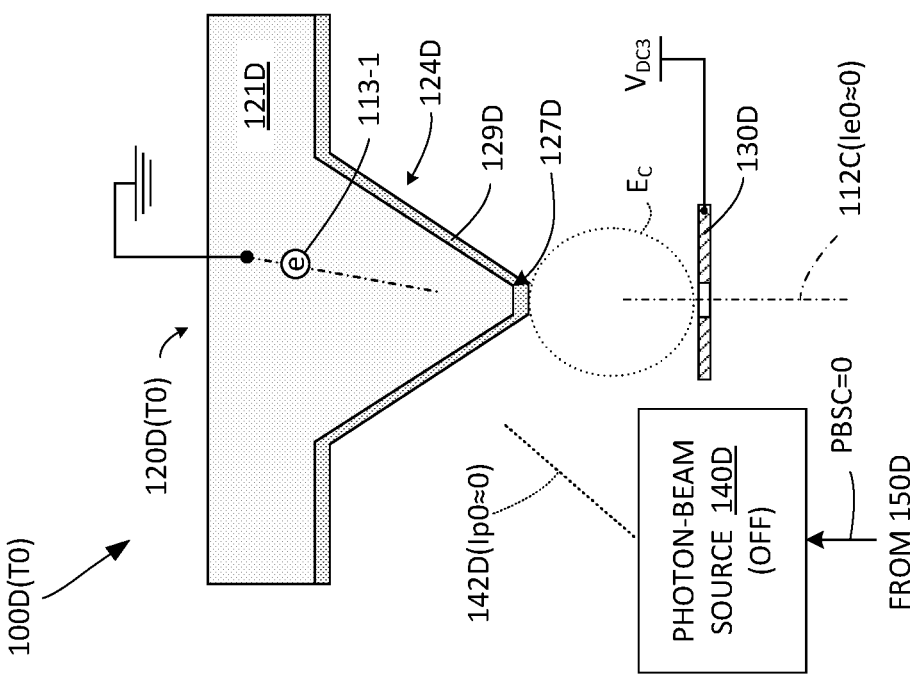

FIGS. 5A and 5B depict portions of an electron source 100D according to another exemplary embodiment in which an electron beam 112D is modulated according to a high/low or on/off modulation scheme. Similar to previous embodiments, a field emitter cathode 120D is formed on a silicon substrate 121D and includes a coating layer 129D that contiguously covers an emission tip 127D of an integral protrusion 124D, an anode (electrode) 130D is maintained by a voltage source $V_{DC3}$ at a positive voltage level that produces an electric field $E_C$ at emission tip 127D, and a photon-beam source 140D is configured to generate a photon beam 142D that is directed onto protrusion 124D near emission tip 127D in accordance with a control signal received from a control circuit 150D (not shown). In this embodiment, electron source 100D periodically switches between two operating states corresponding to two different electron beam emission current target levels, which occur during two successive different time periods that are respectively depicted in FIGS. 5A and 5B. Specifically, FIG. 5A shows electron source 100D in a first operating state during a first time period T0 when electron beam 112D is generated with a relatively low (first) emission current level Ie0, and FIG. 5B shows electron source 100D during a second time period T1 when electron beam 112D is generated with a relatively high (second) emission current Te1, which is greater (larger) than emission current Ie0. FIGS. 5A and 5B specifically depict electron source 100D during implementation of an on/off modulation scheme by way of indicating that relatively low emission current Ie0 is zero or substantially zero during first time period T0. When electron source 100D is configured to implement a high/low modulation scheme, relatively low emission current Ie0 may be substantially greater than zero, but less than emission current Te1.

To implement the high/low or on/off modulation scheme depicted in FIGS. 5A and 5B, control circuit 150D is configured to modulate electron beam 112D by way of controlling a photon-beam source 140D such that photon beam 142D is periodically switched between a relatively low (first) intensity (e.g., as indicated in FIG. 5A) and a relatively high (second) intensity (e.g., Ip1>>0, as indicated in FIG. 5B). Specifically, FIG. 5A indicates that control circuit 150D generates and transmits a first photon-beam source control signal (e.g., PBSC=0) to photon-beam source 140D during time period T0, and FIG. 5B indicates that control circuit 150D generates/transmits a different (second) photon-beam source control signal (e.g., PBSC=1) to photon-beam source 140D during time period T1. As indicated in FIG. 5A, in response to the first photon-beam source control signal (PBSC=0), photon-beam source 140D generates photon beam 142D at the relatively low intensity Ip0 such that a relatively small number (e.g., zero) of photons are transmitted onto emitter cathode 120D, thereby producing a relatively small amount (e.g., zero or a minimal amount) of photo-assisted field emission, whereby electron beam 112D is generated by emitter cathode 120D with a relatively low emission current Ie0. In other words, if zero photons are transmitted onto emitter cathode 120D during time period T0, emitter cathode 120D generates electron beam 112C solely by the extraction field provided by electric field $E_C$, whereby emission current Ie0 is relatively low. In contrast, as indicated in FIG. 5B, photon-beam source 140D generates photon beam 142D at relatively high intensity Ip1 in response to the second photon-beam source control signal (PBSC=1) such that a relatively large number of photons are transmitted onto emitter cathode 120D during second time period T1, whereby emitter cathode 120D generates electron beam 112D using a combination of the current generated by extraction field provided by electric field $E_C$ and the energy/electrons produced by photon beam 142D, which in turn causes electron beam 112D to have a relatively high emission Ie1 during time T1 (i.e., in comparison to emission current Ie0 during time T0).

In one embodiment, the modulation scheme depicted in FIGS. 5A and 5B is used to clean contamination from tip 127D. In a conventional cold field emitter, the tip temperature can be raised to cause contaminants to evaporate from the tip (flashing). This process is slow since it takes seconds for the tip to heat up and then the tip needs to be maintained at the higher temperature for long enough for contaminants to leave the tip, which may take milliseconds or seconds, then the tip needs to be allowed to cool down which can take seconds to minutes. Furthermore, the mechanical dimensions of the tip and the structures supporting it change with temperature due to thermal expansion and contraction. Additional time is typically required to allow the tip emission to stabilize after flashing as the changes in dimensions and tip location change the emission current. In one embodiment of the current invention, a high current is used to drive contaminants from the tip 127D. When the current is high (such as 1 µA or a few µA), electrons can collide frequently with the contaminant and may dislodge it. This can happen in a time period less than a few microseconds, or as short as a few nanoseconds. After this short time period, the photon-beam intensity may be reduced to a lower value and normal system operation may be resumed. Since the time required for cleaning is so short, the impact on system performance may be minimal or zero. For example, the high current for cleaning may be implemented at the end of a scan line or a scan frame when, for a brief time, no data is being collected, so that the cleaning causes no change in the time to acquire an image. A high current, such as one greater than 1 µA, may damage tip 127D if used for an extended period of time since the tip 127D can become very hot and may deform. But if the high current is present only for a few microseconds or a shorter time, the heating effect will be minimal, and no tip damage will result.

According to a specific embodiment in which electron source 100D is configured to implement an on/off modulation scheme, the scheme utilizes the following features. First, emitter cathode 120D is fabricated on a p-doped substrate 121D, and coating layer 129D is a p-type material (e.g., boron), and anode 130D is configured to generate an electric field $E_C$ at emission tip 127D of field emitter cathode 120D such that a potential barrier height (conduction band) of field emitter cathode 120D is maintained at a level that is above a Fermi level of field emitter cathode 120D at the emission tip 127D, thereby minimizing or eliminating an emission of electrons from emission tip 127D during first time period T0, (i.e., emission current Ie0 of electron beam 112D is zero or nearly zero when intensity Ip0 of photon beam 142D is minimized). In a semiconductor, where the electron concentration is determined by the local doping level and potential, it is possible to configure the field emitters to be operated in reverse bias mode as in a p-n diode, in which a depletion layer is generated due to the high electric field at the emitter surface. The interface between vacuum and a p-type doped field emitter can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of the emission tip, and an electric current, on the order of nA to µA is produced. In accordance with the on/off modulation scheme shown in FIGS. 5A and 5B, electric field $E_C$ is maintained just above the Fermi energy level so that no electrons are emitted when photon beam 142D is omitted (e.g., when photon-beam source 140D is turned off, as indicated in FIG. 5A). As indicated in FIG. 5B, electric field $E_C$ is also maintained at this level during time period T1, but in this case photo-electrons 113-2 created when incident photons 143 having energy level/wavelength λp generate electron-hole pairs EHP will be strongly attracted towards emission tip 127D, and many of these photo-electrons will be emitted to provide electron beam 112D with the desired emission current Ie1.

Figure 6:
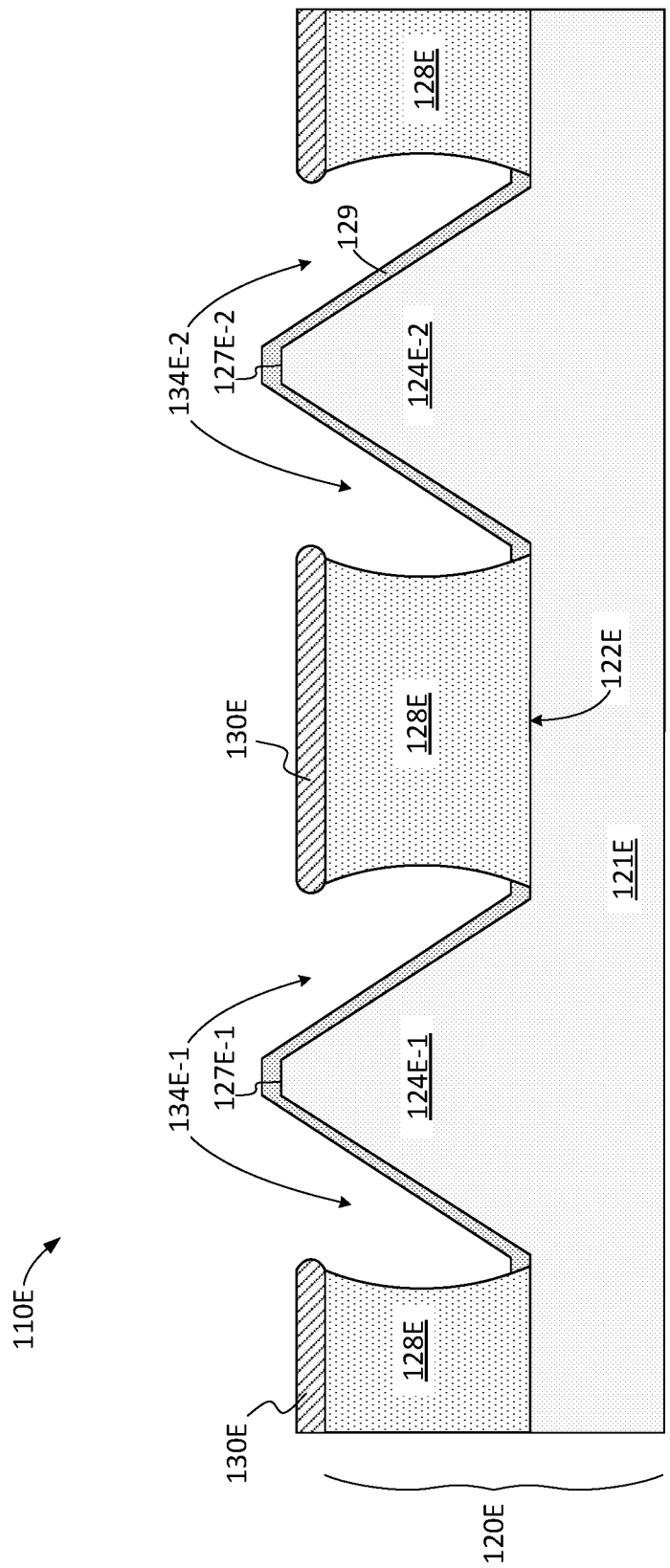
FIG. 6 is a cross-sectional side view illustrating multiple field emitter cathodes formed on a silicon substrate according to another exemplary embodiment of the present invention.

FIG. 6 illustrates, in cross section view, a silicon field emitter 110E for a field emitter array (FEA) multi-electron-beam source according to yet another alternative embodiment. Similar to the embodiment described above with reference to FIG. 2, field emitter 110E an extractor (electrode) 130E fixedly disposed on an emitter cathode 120E by way of a dielectric layer 128E, which is formed on a top surface 122E of a silicon substrate 121E. In this case emitter cathode 120E includes multiple field emitter protrusions (e.g., protrusions 124E-1 and 124E-2) that are arranged in a two-dimensional periodic pattern and respectively integrally connected to top (output) surface 122 of silicon substrate 121E. Field emitter protrusions 124E-1 and 124E-2 are respectively disposed in openings formed in dielectric layer 128E, and extractors 130E is formed such that apertures 134E-1 and 134E-2 respectively surround emitter protrusions 124E-1 and 124E-2. During operation, each emitter protrusions 124E-1 and 124E-2 is subject to an applied electric field from extractor (gate) 130E and receives photons from a photo source (not shown) for purposes of modulating electron beams respectively emitted from emission tips 127E-1 and 127E-2 using the methods described. Although extractor 130E is depicted as a single contiguous layer, it may be divided into sections corresponding to the individual emitter protrusions 124E-1, 124E-2, etc., so that separate extraction voltages may be applied to each emitter section to allow individual control of the electric field applied to each emission tip. Other materials and dimensions of field emitter cathode 100E may be configured similarly to those of field emitter cathode 110A illustrated in FIG. 2 and will not be described separately here.

Figure 7:
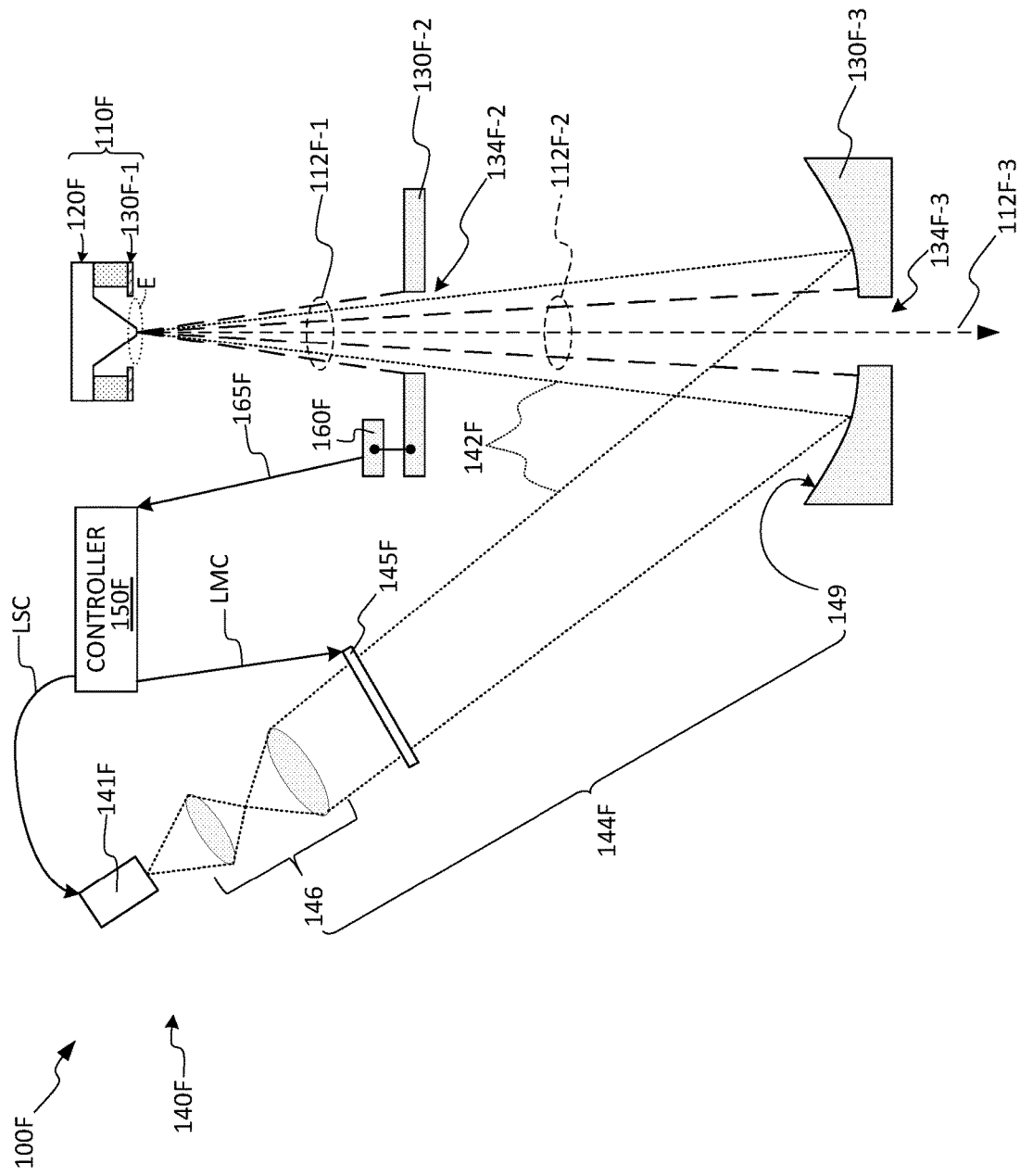
FIG. 7 illustrates an electron source according to another exemplary embodiment of the present invention.

FIG. 7 illustrates a simplified electron source 100F according to another exemplary practical embodiment of the present invention. Similar to previous embodiments, a field emitter 110F includes a cathode 120F and an extractor 130E-1 that operate as described above. In this embodiment, photon-beam source 140F includes a light source 141F configured to generate at least one photon beam 142F that is directed by a focusing apparatus (optics) 144F onto field emitter 110F for purposes of modulating (controlling) electron beam 112F according to any of the modulation schemes mentioned above. An electrode 130E-2 is placed at a distance from the field emitter surface for generating an accelerating field between the surface of the field emitter 110F and anode 130F with a high voltage source, such as an accelerating voltage between about 1 kV and about 10 kV. Anode 130E-2 has an aperture 134F-2 which may be configured as a beam stop that allows part of electron beam 112F to pass through. In other words, the electrons emanating from field emitter 110F are guided through aperture 134F-2 in anode 130E-2 to form at least a portion of electron beam 112F exiting electron source 100F. In one embodiment part of electron beam 112F impinges on anode 130E-1, and a monitor 160F is operably configured to sense or otherwise measure the emission current of electron beam 112F at each moment during operation by way of contact with anode 130E-1, and to generate and transmit corresponding emission current measurement values 165F to control circuit 150F. Control circuit 150F is configured to modulate electron beam 112F by way of controlling photon-beam source 140F to adjust (e.g., increase or decrease) the intensity of photon beam 142F according to changes in emission current measurement values 165F and a selected modulation scheme.

Referring to the lower portion of FIG. 7, an additional electrode 130E-3 is positioned downstream of anode 130E-2 (i.e., along the path of electron beam 112F) and includes an aperture 134F-3 through which a terminal portion 112F-3 of the electron beam passes. Electrode 130E-3 may be configured to act as a beam stop, i.e. aperture 134F-3 may be small enough to limit the range of angles of electron beam portion 112F-3 passing through it. Alternatively, aperture 134F-3 may be large enough to pass substantially all of electron beam portion 112F-2 received from anode 130E-2. In one embodiment, electrode 130E-3 is made of a metal such as aluminum or silver and includes a curved (e.g., parabolic) mirror surface 149 (which forms part of focusing apparatus 140F, along with collimating lenses 146). Electrode 130E-3 is positioned and arranged relative to light source 141F and field emitter 110F such that photon beam 142F is redirected and focused by curved mirror surface 149 onto the output surface of field emitter 110F (e.g., the emission tip of field emitter 110F is placed at the focus of a parabola formed by curved mirror surface 149 and the incoming light beam from optics 146 is substantially collimated). A high voltage source may be used to bias electrode 130E-3 with respect to field emitter cathode 120F and anode 130F such that the electrons are accelerated after passing through anode 130E-2. In an alternative embodiment, anode 130E-2 may be omitted and controller 150F may monitor the current flowing in electrode (beam-stop) 130E-2. In another embodiment optics for directing and focusing photon beam 142F are separate from any electrodes and aperture stops. Other structures and elements that may be utilized in SEM systems are omitted for brevity.

During operation of source 100F, controller 150F modulates the emission current of electron beam 112F by way of controlling the intensity of photon beam 142F, which generated by light source 141F in accordance with a selected modulating scheme and directed onto emitter cathode 110F by way of parabolic mirror 149. Light source 141F may comprise a laser diode, a pulsed laser, a continuous wave (CW) laser or a lamp. The wavelength of photons generated by light source 141F may be in a visible or UV wavelength range. Photon beam 142F may be collimated by focusing apparatus 144F (e.g., collimating lenses 146), which also functions to focus/direct photon beam 142 onto field emitter cathode 110F by way of parabolic mirror 149 such that the focused photon beam passes through aperture 136F of anode 130F. The photons of photon beam 142F assist in releasing electrons from the surface of field emitter cathode 110F in the manner described above. An intensity of photon beam 142F may be adjusted by a controller 150F by way of controlling light source 141F (e.g., using light source control signal LSC) or by way of controlling an optical modulator 145F (e.g., using light modulator control signal LMC). Optical modulator 145F is preferably an electro-optic modulator when high-frequency control of the electron emission is required, such as frequencies of about 100 MHz or higher. The combination of lenses and mirrors forming focusing apparatus 140F illustrate one example of a photon-beam source can be configured to control electron emissions from a field emitter. Other combinations of lenses, flat mirrors and/or curved mirrors may be configured to direct and focus a photon beam onto a field emitter cathode.

Figure 8:
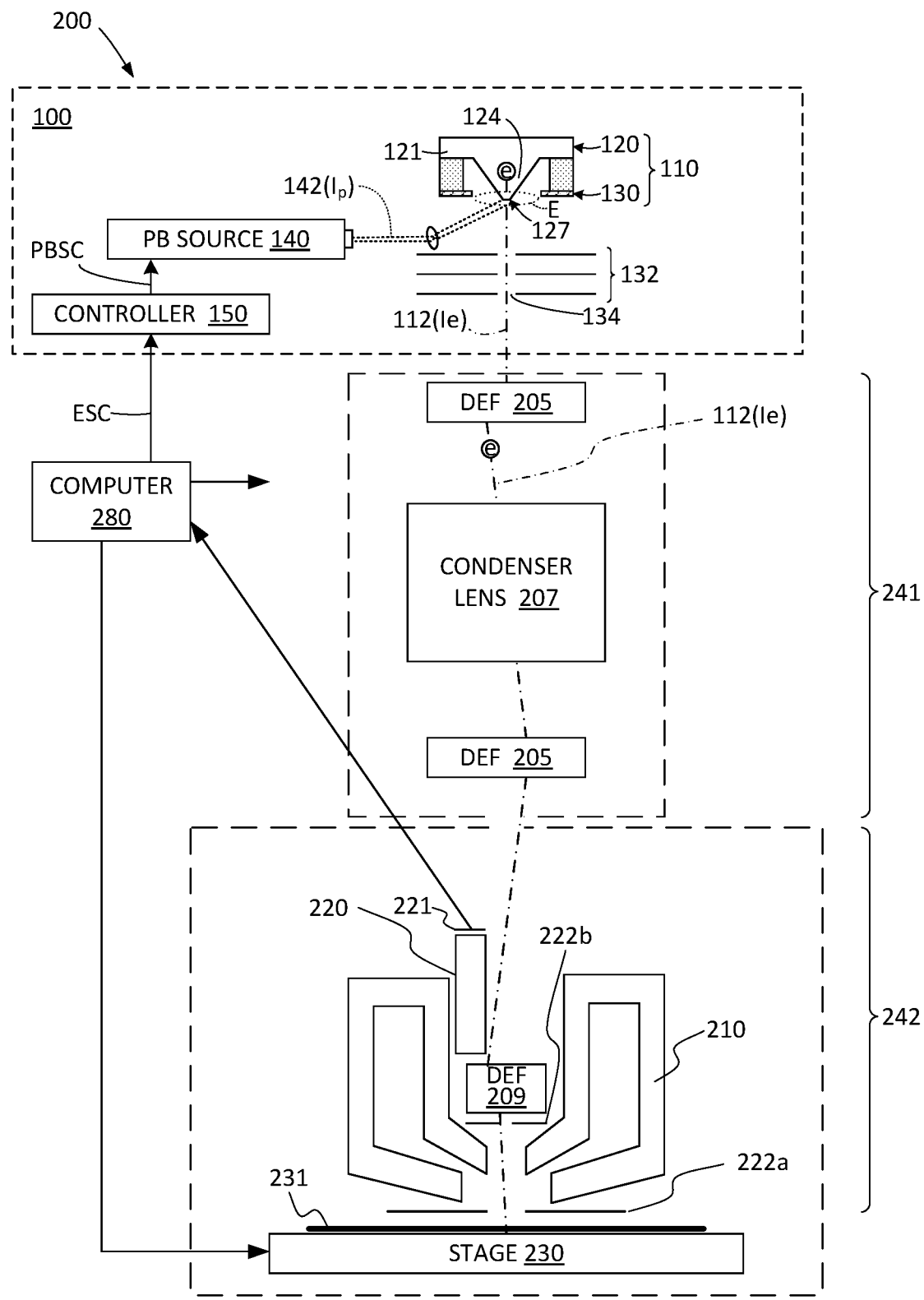
FIG. 8 illustrates an exemplary SEM incorporating an embodiment of an electron source, electron optics, a back-scattered electron detector, and a secondary electron detector in accordance with a practical embodiment of the present invention.

FIG. 8 illustrates an exemplary inspection, metrology, or review scanning electron microscope (SEM) system (device) 200 configured to inspect, measure or review a sample 231 such as a semiconductor wafer, reticle, or photomask. SEM system 200 generally includes an electron column comprising an electron gun (electron source) 100, an upper column 241, and a lower column 242 focuses and directs a primary electron beam 112 onto sample 231.

Electron gun 100 is configured in accordance with any of the embodiments set forth above including a field emitter 110 (which includes a field emitter cathode 120 and an extractor 130), one or more electrodes 132, a photo-beam source 140 and a controller (control circuit) 150. As set forth above, field emitter cathode 120 includes a silicon substrate 121 having an integral emitter protrusion 124 with an emission tip 127 disposed at its distal end, and extractor 130 is configured to generate an extraction (electric) field E at emission tip 127, and to form electrons emitted from emission tip 127 into a primary electron beam 112 that passes through apertures 134 and into upper column 241. Photon-beam (PB) source 140 and controller 150 function as described above to facilitate photo-assisted field emission of primary electron beam 112 from electron gun 100. That is, controller 150 optionally monitors primary electron beam 112 using any of the methods discussed above, and controls PB source 140 by way of a photon-beam source control signal PBSC such that photon-beam applies photon beam 142 onto emitter cathode 120 with an intensity Ip that causes emitter cathode 120 to emit primary electron beam 112 with an emission Ie received from computer system 280 (as set forth below). Electrodes 132 may include one or more focusing electrodes, one or more deflectors, a stigmator, and/or a beam blanker. One of electrodes 132 is configured as an anode to accelerate the electrons in electron beam 112 after they have been extracted from emission tip 127. The anode may be configured to operate as a beam stop. Alternatively, or in addition, a beam stop may be included in upper column 241.

Upper column 241 comprises electron optics including one or more condenser lenses 207 that de-magnify primary electron beam 112 to create a small spot of impinging electrons on an underlying sample 231. One or more deflectors (DEF) 205 may be placed on either side of condenser lens 207. Upper column 241 may further include other electron optics such as a stigmator or a beam blanker. Lower column 242 comprises electron optics including a final lens 210 for focusing the primary electron beam 112 to a small spot on sample 231. Lower column 242 also includes one or more deflectors 209 that work in combination with deflectors 205 (if present) to scan the primary electron beam across an area of the sample 231. Sample 231 is placed on a stage 230 in order to facilitate movement of different regions of sample 231 underneath the electron column. Secondary electrons and back-scattered electrons are emitted from the sample 231 when the primary electron beam 112 hits it. Secondary electrons may be collected and accelerated by electrodes 220 and directed to secondary electron detector 221. Back-scattered electrons may be detected by a back-scattered electron detector such as those shown at 222a and 222b.

Computer system 280 controls the electron source 100 and the electron optics of upper column 241 and lower column 242, and receives data from at least one of the secondary electron detector 221, the backscattered electron detector 222a and the backscattered electron detector 222b. Computer system 280 also controls stage 230. Computer system 280 causes the scanning electron microscope to perform an inspection, measurement or review of one or more areas on sample 231 using data from the one or more detectors. Computer 280 directs controller 150 to generate a selected electron beam current in the manner set forth above.

While described as integrated into an SEM, the electron source disclosed herein also can be incorporated into other devices, for example, an electron-beam lithography system or an X-ray source. The electron-beam lithography system can include electron optics that are configured to de-magnify and focus the primary electron beam onto a target and a modulator for modulating the intensity of the electron beam. The X-ray source can include electron optics configured to direct the electron beam to an anode configured to emit X-rays.

Various modifications to the described embodiments will be apparent to those with skill in the art, and the general principles defined herein may be applied to other embodiments. For example, additional electrodes may be placed close to the electron emitter to control the emission, and/or to focus and direct the emitted electrons in a specific direction. Although it is expected that that the light-modulated electron source disclosed herein will be particularly useful in various kinds of scanning electron microscopes and electron-beam lithography systems, it is also envisioned that this source may be useful in other applications where stable, high-radiance and/or high-current electron beams are required, such as in a high-brightness X-ray generator.

The electron sources and methods described herein are not intended to be limited to the embodiments shown and described but are to be accorded the widest scope consistent with the principles and novel features herein disclosed. Hence, the present disclosure is deemed limited only by the appended claims and the reasonable interpretation thereof.

What is claimed is:

1. A light modulated electron source comprising:
a field emitter cathode including a silicon substrate having opposing first and second surfaces, and an emitter protrusion having a base integrally connected to the silicon substrate, a body portion extending from the first surface, and an emission tip disposed at a distal end of the body portion;
a dielectric layer disposed on the first top surface adjacent to the emitter protrusion;
an extractor disposed on the dielectric layer and fixedly positioned adjacent to the field emitter cathode, the extractor being configured to generate an electric field that attracts electrons in the silicon substrate toward the emission tip;
an anode that is disposed at an offset distance of at least 1 mm from the emission tip and has an aperture, said anode being configured such that electrons emitted from the emission tip form an electron beam that passes through the aperture;
a photon-beam source configured to generate a photon beam including photons having a wavelength shorter than about 1 μm, and configured to direct said photon beam onto the emitter protrusion such that at least some of said photons are absorbed by said field emitter cathode; and
a control circuit configured to modulate an emission current of the electron beam by controlling an intensity of the photon beam transmitted from the photon-beam source and received by the field emitter cathode,
wherein a nominal height of the extractor above the first surface is approximately ±300 nm of a height of the emission tip,
wherein the extractor is maintained at a first positive voltage relative to the field emitter cathode, and
wherein the anode is maintained at a second positive voltage relative to the field emitter cathode, the second positive voltage being greater than the first positive voltage.

2. The electron source of claim 1,
wherein the emission tip has a lateral dimension in the range of 1 nm to 50 nm,
wherein the electron source further comprises an antioxidation coating layer disposed on the silicon substrate such that it entirely contiguously covers the emission tip, and
wherein the antioxidation coating layer comprises one of boron, a boride and a carbide and has a thickness between 1 nm and 10 nm.

3. The electron source of claim 2, wherein the extractor is maintained at least 30 V relative to the field emitter cathode, and said anode is maintained at least 500 V relative to the field emitter cathode.

4. The electron source of claim 1, wherein said photon-beam source comprises a light source configured to generate said photons with a wavelength longer than 250 nm.

5. The electron source of claim 4, wherein said photon-beam source further comprises at least one of a focusing apparatus and a light modulation device disposed in a path of said photon beam between the light source and said field emitter cathode.

6. The electron source of claim 5, wherein the focusing apparatus comprises at least one mirror configured to direct said photon beam through an aperture formed in the extractor.

7. The electron source of claim 5, wherein the control circuit is configured to control the intensity of the photon beam by controlling at least one of said light source and said light modulation device.

8. The electron source of claim 7, further comprising at least one monitor configured to measure said emission current of said electron beam and to generate a corresponding emission current measurement value,
wherein the control circuit is further configured to generate a control signal in accordance with said emission current measurement value, and
wherein at least of one of said light source and said light modulation device is controlled by said control signal.

9. The electron source of claim 1, wherein the control circuit is configured to control the photon-beam source such that said photon beam is generated with a first intensity during a first time period and generated with a second intensity during a second time period, said second intensity being higher than the first intensity.

10. A light modulated electron source comprising:
- a field emitter cathode including a silicon substrate having opposing first and second surfaces, and an emitter protrusion having a base integrally connected to the silicon substrate, a body portion extending from the first surface, and an emission tip disposed at a distal end of the body portion;
- a dielectric layer disposed on the first top surface adjacent to the emitter protrusion;
- an extractor disposed on the dielectric layer and fixedly positioned adjacent to the field emitter cathode, the extractor being configured to generate an electric field that attracts electrons in the silicon substrate toward the emission tip;
- an anode that is disposed at an offset distance of at least 1 mm from the emission tip and has an aperture, said anode being configured such that electrons emitted from the emission tip form an electron beam that passes through the aperture;
- a photon-beam source configured to generate a photon beam including photons having a wavelength shorter than about 1 µm, and configured to direct said photon beam onto the emitter protrusion such that at least some of said photons are absorbed by said field emitter cathode; and
- a control circuit configured to modulate an emission current of the electron beam by controlling an intensity of the photon beam transmitted from the photon-beam source and received by the field emitter cathode, wherein the control circuit is configured to control the photon-beam source such that said photon beam is generated with a first intensity during a first time period and generated with a second intensity during a second time period, said second intensity being higher than the first intensity, wherein the silicon substrate comprises p-doped silicon, and
- wherein the anode is further configured to generate an electric field at the emission tip such that a potential barrier of the field emitter cathode is maintained above a Fermi level of the field emitter cathode at the emission tip, and
- wherein the control circuit is configured to control the photon-beam source such that said first intensity of said photon beam is minimized, thereby minimizing an emission of electrons from emission tip during said first time period, and such that said second intensity is substantially higher than said first intensity during said second time period, whereby a sufficient number of said photons are absorbed by said field emitter cathode to produce a photo-assisted field emission of said electron beam from the emission tip.

11. The electron source of claim 1, wherein the field emitter cathode comprises a plurality of field emitter protrusions integrally connected to the first surface of the silicon substrate and arranged in a two-dimensional periodic pattern.

12. A device including an electron source configured to generate an electron beam, wherein the electron source comprises:
- a field emitter cathode including a silicon substrate having opposing first and second surfaces, and an emitter protrusion having a base integrally connected to the silicon substrate, a body portion extending from the first surface, and an emission tip disposed at a distal end of the body portion;
- an extractor having a first aperture and configured to generate and apply an electric field on the field emitter cathode such that electrons emitted from the emission tip form the electron beam and such that the electron beam passes through the first aperture;
- an anode having a second aperture and disposed at an offset distance of at least 1 mm from the emission tip, said anode being configured such that said electron beam passes through the second aperture;
- a photon-beam source configured to generate a photon beam including photons having a wavelength shorter than about 1 µm and being directed onto the emitter protrusion such that at least some of said photons are absorbed by said field emitter cathode; and
- a control circuit configured to modulate an emission current of the electron beam by controlling an intensity of the photon beam transmitted from the photon-beam source and received by the field emitter cathode,
- wherein the device further comprises electron optics configured to direct the primary electron beam to a sample,
- wherein a nominal height of the extractor above the first surface is approximately ±300 nm of a height of the emission tip,
- wherein the extractor is maintained at a first positive voltage relative to the field emitter cathode, and
- wherein the anode is maintained at a second positive voltage relative to the field emitter cathode, the second positive voltage being greater than the first positive voltage.

13. The device of claim 12, wherein the device is a scanning electron microscope (SEM), wherein the electron optics are configured to de-magnify and focus the primary electron beam onto the sample, and wherein the device further comprises a detector for detecting at least one of back-scattered electrons and secondary electrons from the sample.

14. The device of claim 12, wherein the device is an electron-beam lithography system, wherein the electron optics are configured to de-magnify and focus the primary electron beam onto the sample.

15. The device of claim 12, wherein the device is an X-ray source, and wherein the electron optics are configured to direct the primary electron beam to an anode.

16. The device of claim 12, further comprising a dielectric layer disposed on the first surface adjacent to the emitter protrusion,
- wherein the extractor is disposed on the dielectric layer such that the dielectric layer is disposed between the extractor and the substrate,
- wherein the emission tip has a lateral dimension in the range of 1 nm to 50 nm,
- wherein the electron source further comprises an antioxidation coating layer disposed on the silicon substrate such that it entirely contiguously covers the emission tip, and
- wherein the antioxidation coating layer comprises one of boron, a boride and a carbide and has a thickness between 1 nm and 10 nm.

17. A device including an electron source configured to generate an electron beam, wherein the electron source comprises: a field emitter cathode including a silicon substrate having opposing first and second surfaces, and an emitter protrusion having a base integrally connected to the silicon substrate, a body portion extending from the first surface, and an emission tip disposed at a distal end of the body portion;
- an extractor having a first aperture and configured to generate and apply an electric field on the field emitter cathode such that electrons emitted from the emission tip form the electron beam and such that the electron beam passes through the first aperture;

an anode having a second aperture and disposed at an offset distance of at least 1 mm from the emission tip, said anode being configured such that said electron beam passes through the second aperture;

a photon-beam source configured to generate a photon beam including photons having a wavelength shorter than about 1 μm and being directed onto the emitter protrusion such that at least some of said photons are absorbed by said field emitter cathode; and a control circuit configured to modulate an emission current of the electron beam by controlling an intensity of the photon beam transmitted from the photon-beam source and received by the field emitter cathode, wherein the device further comprises electron optics configured to direct the primary electron beam to a sample, wherein the extractor is maintained at least 30 V relative to the field emitter cathode, and said anode is maintained at least 500 V relative to the field emitter cathode.

18. The device of claim 12, wherein said photon-beam source comprises a light source configured to generate said photons with a wavelength longer than 250 nm.

19. The device of claim 18, wherein said photon-beam source further comprises at least one of a focusing apparatus and a light modulation device disposed in a path of said photon beam between the light source and said field emitter cathode.

20. The device of claim 12, wherein the field emitter cathode comprises a plurality of field emitter protrusions integrally connected to the first surface of the silicon substrate and arranged in a two-dimensional periodic pattern.

* * * * *